(12) United States Patent  
Ishizu et al.

(10) Patent No.: US 9,257,173 B2
(45) Date of Patent: Feb. 9, 2016

(54) ARITHMETIC PROCESSING UNIT AND DRIVING METHOD THEREOF

(71) Applicant: SEMICONDUCTOR ENERGY LABORATORY CO., LTD., Atsugi-shi, Kanagawa-ken (JP)

(72) Inventors: Takahiko Ishizu, Kanagawa (JP); Kiyoshi Kato, Kanagawa (JP); Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/515,949

(22) Filed: Oct. 16, 2014

(65) Prior Publication Data

US 2015/0109870 A1 Apr. 23, 2015

(30) Foreign Application Priority Data

Oct. 18, 2013 (JP) .................................. 2013-216907

(51) Int. Cl.
  *G11C 11/00* (2006.01)
  *G11C 11/419* (2006.01)
  *G11C 11/412* (2006.01)
(52) U.S. Cl.
  CPC ............ *G11C 11/419* (2013.01); *G11C 11/412* (2013.01)
(58) Field of Classification Search
  CPC .............................. G11C 11/401; G11C 11/41
  USPC .................................................. 365/154, 149
  See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Han Yang
(74) *Attorney, Agent, or Firm* — Fish & Richardson P.C.

(57) ABSTRACT

An arithmetic processing unit including an SRAM with low power consumption and performing backup and recovery operation with no burden on circuits. One embodiment is a memory device including a plurality of memory cells. The memory cells include inverters in which capacitors for backing up data are provided. When data of all the memory cells in a region is not rewritten after data is returned from the capacitors to the inverters, data in the region is not transferred from the inverters to the capacitors and the inverters are turned off. When data of at least one of the memory cells in the region is rewritten, data in the region is transferred from the inverters to the capacitors and then power of the inverters are turned off. In this manner, backup is selectively performed to reduce power consumption. Other embodiments are described and claimed.

10 Claims, 25 Drawing Sheets

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,817,516 B2 | 8/2014 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0297215 A1* | 12/2007 | Hashimoto .......... G11C 11/413 365/149 |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0262982 A1* | 10/2012 | Takemura ............ G11C 11/412 365/149 |
| 2012/0314513 A1 | 12/2012 | Kurokawa |
| 2013/0215661 A1 | 8/2013 | Koyama |
| 2013/0223135 A1 | 8/2013 | Koyama |
| 2013/0232365 A1 | 9/2013 | Nishijima |
| 2013/0297874 A1 | 11/2013 | Kurokawa |
| 2013/0297889 A1 | 11/2013 | Fujita |
| 2013/0326157 A1 | 12/2013 | Hara |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID Internaitonal Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09 : Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '08 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner

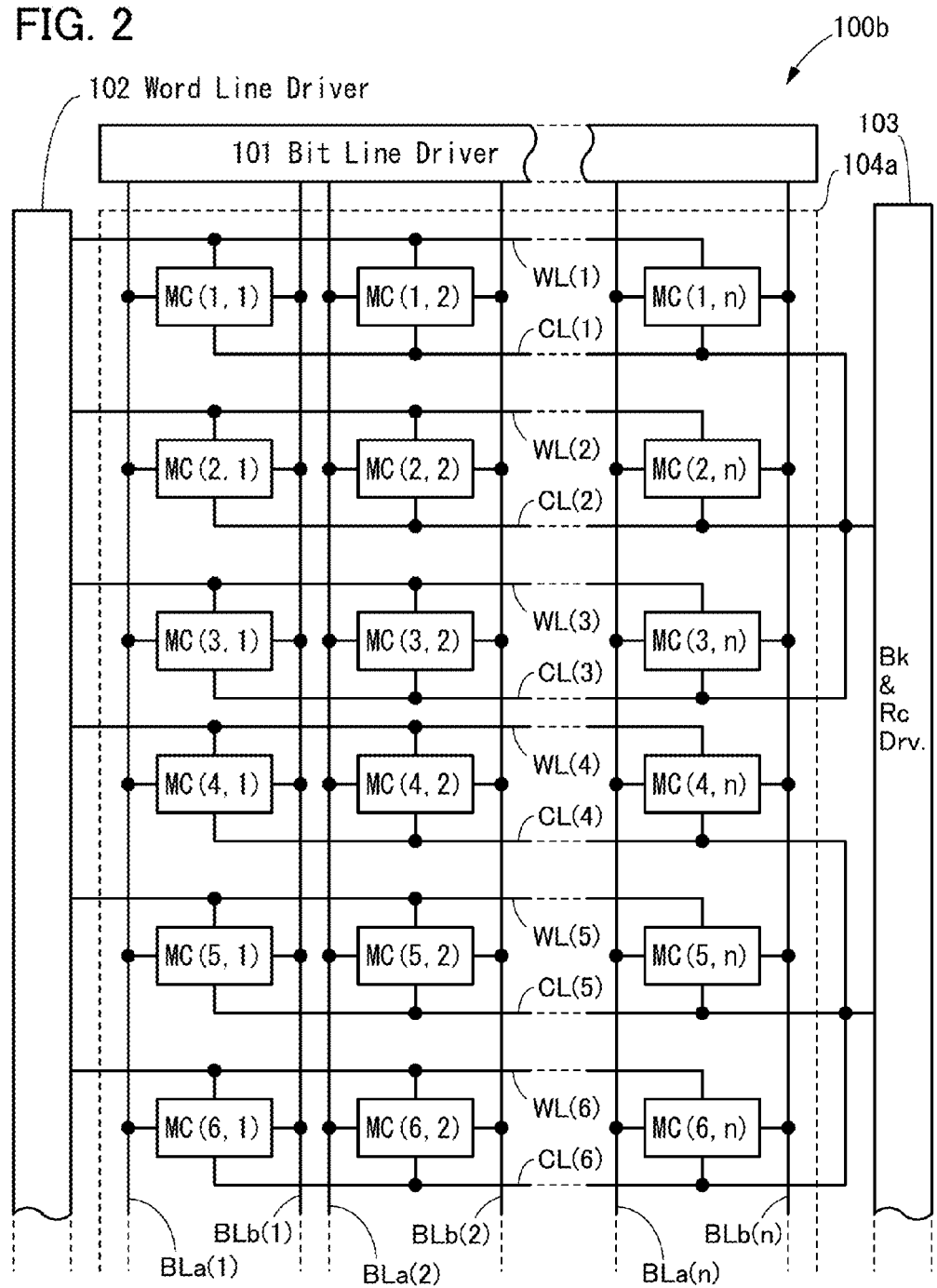

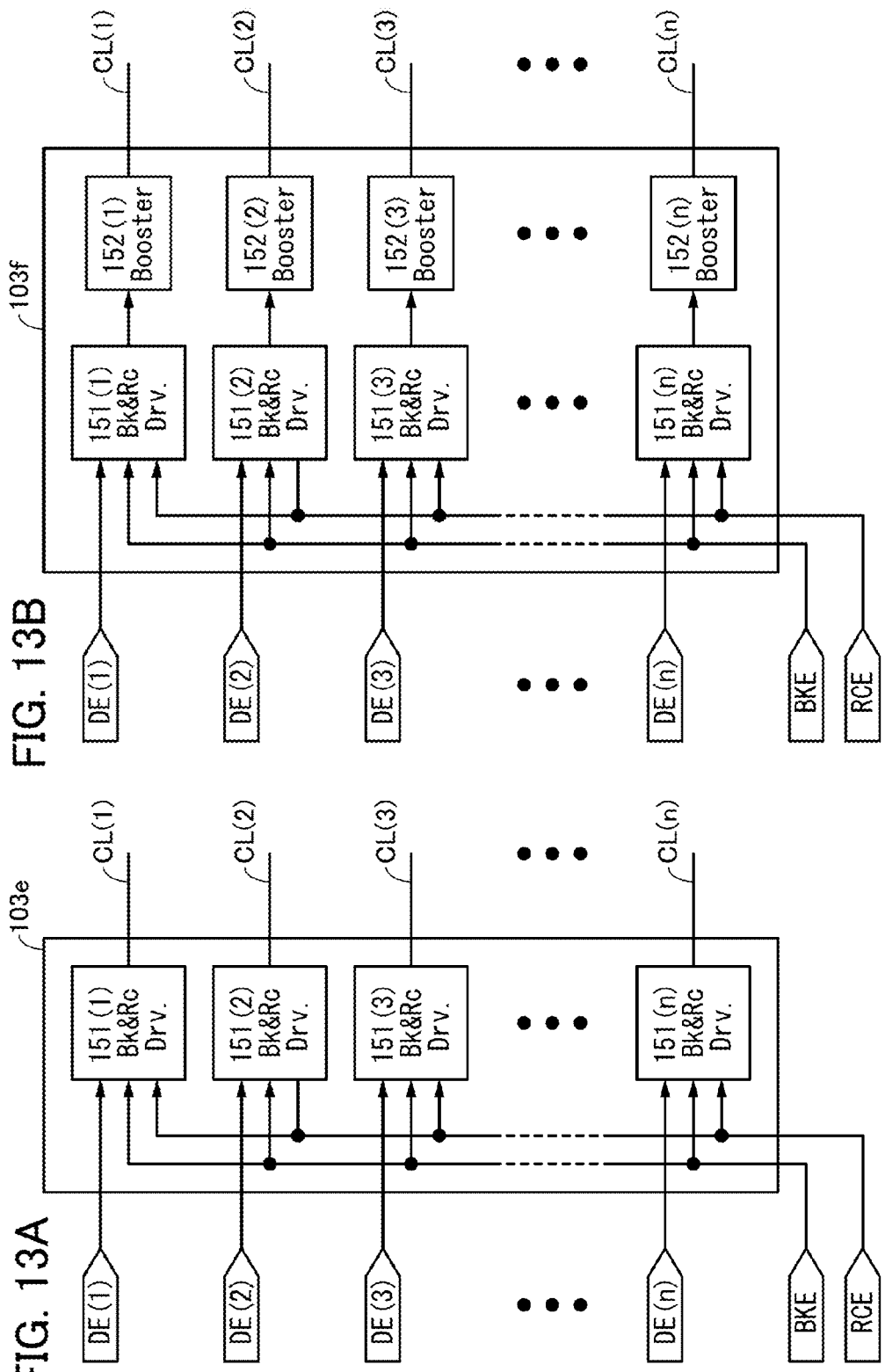

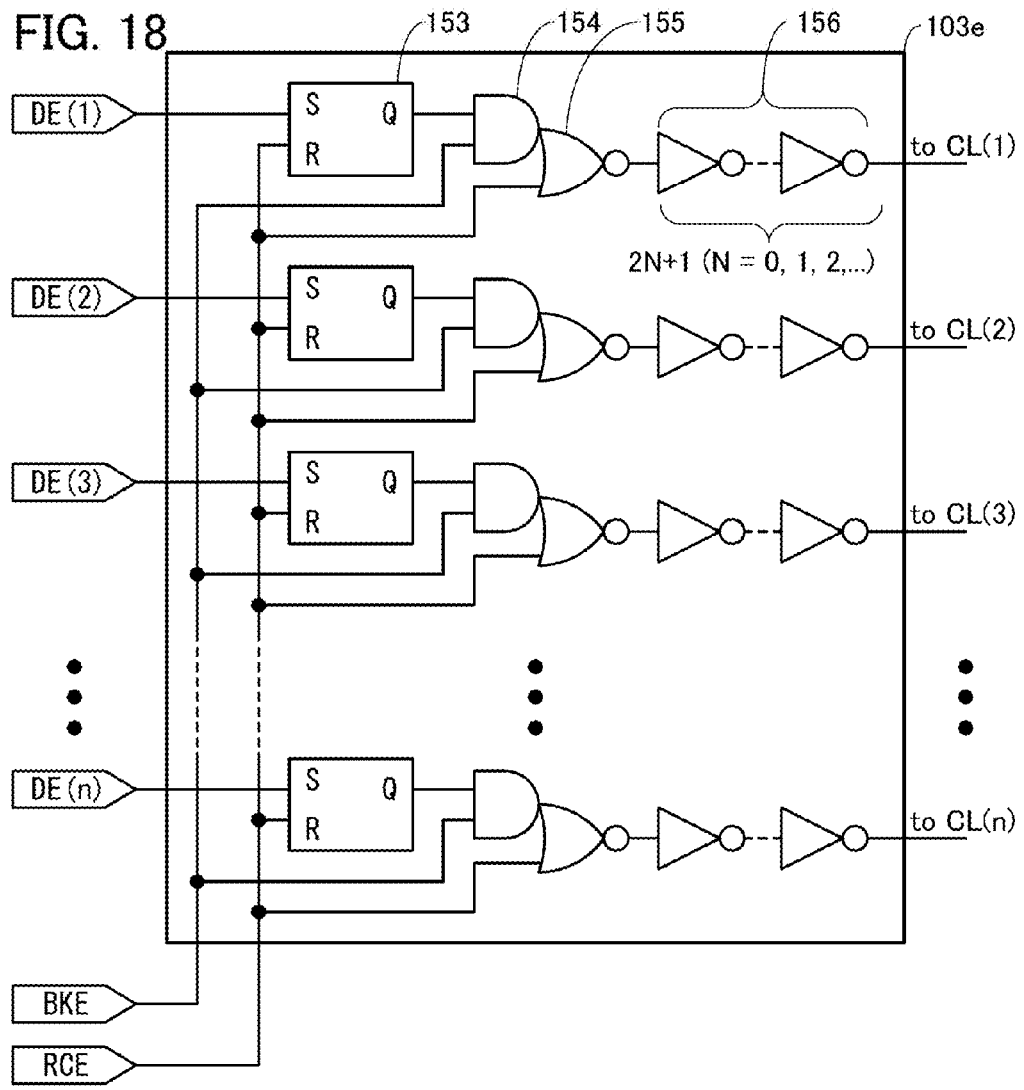

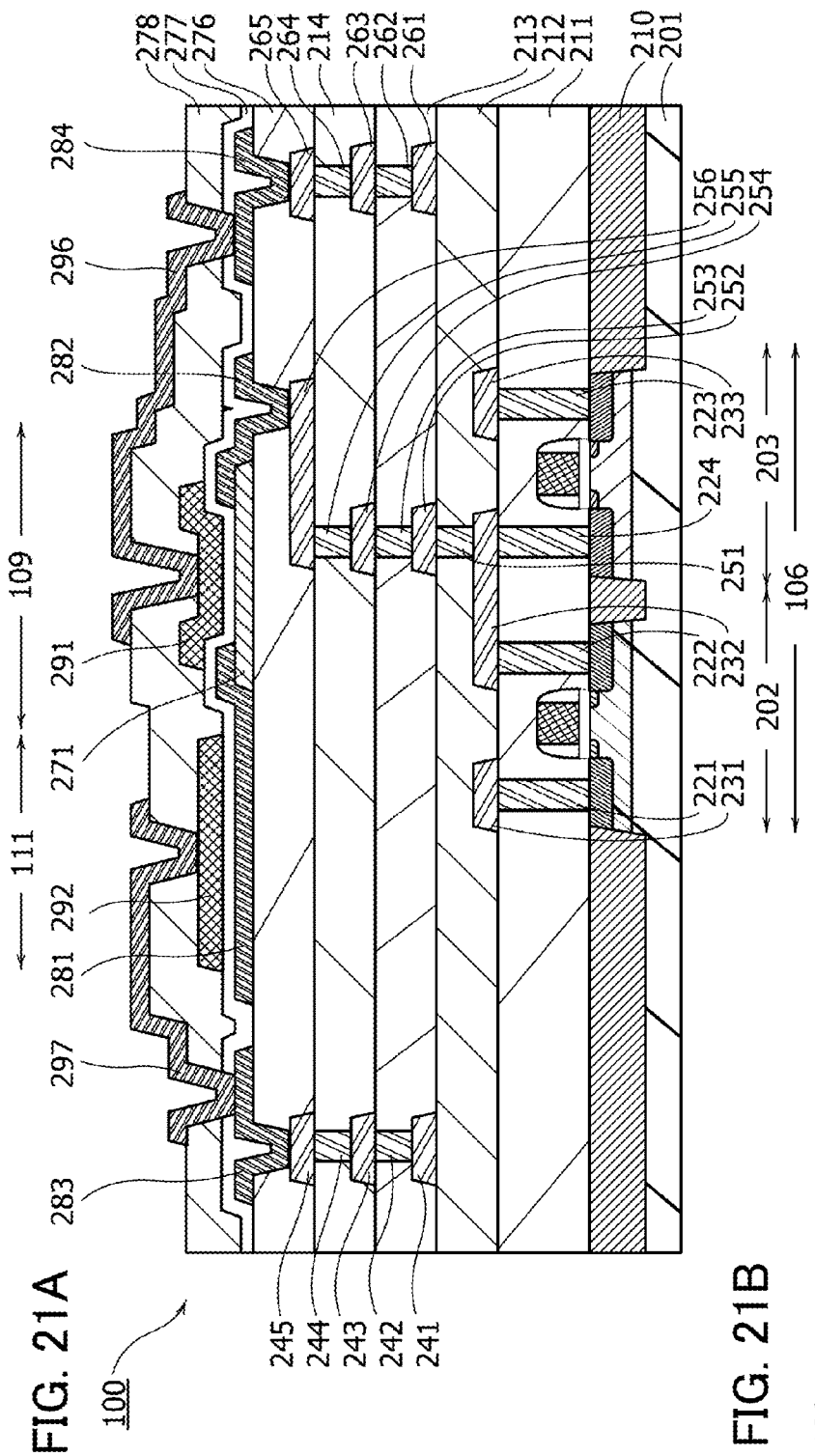

CAAC-OS nc-OS as-sputtered

After Heat
Treatment 450°C

ARITHMETIC PROCESSING UNIT AND DRIVING METHOD THEREOF

BACKGROUND OF THE INVENTION

1. Field of the Invention

One embodiment relates to an arithmetic processing unit.

2. Description of the Related Art

In many arithmetic processing units (e.g., central processing units), architecture called stored program system is employed. In an arithmetic processing unit using the stored program system, instructions and data for executing the instructions are stored in a memory device (e.g., a semiconductor memory device), and the instructions and the data are read sequentially to execute the instructions.

The memory device includes a main memory device for storing data and instructions and a cache memory which can perform data writing and data reading at high speed. In order to reduce access to a low-speed main memory device and speed up the arithmetic processing, a cache memory is provided in an arithmetic processing unit between an arithmetic unit (arithmetic part) or a control unit (control part) of the arithmetic processing unit and the main memory device. In general, a static random access memory (SRAM) or the like is used as a cache memory.

The capacitance of a cache memory provided in an arithmetic processing unit increases year after year. With this increase, the proportion of power consumption of a cache memory to the total consumption of an arithmetic processing unit remarkably increases; thus, various methods have been suggested in order to reduce power consumption of the cache memory.

For example, a method in which a cache memory is divided into several blocks and the less frequently used blocks (or lines) acquired by historical information are operated with a low voltage has been suggested. A method for stopping power supply to a cache line which is less likely to be accessed has also been suggested.

The cache memory needs to hold data and the like even when arithmetic operation is hardly performed. In such a case, power consumption can be reduced by backing up data in the other memory device and stopping the supply of power to the cache memory. The other memory device for backing up data is preferably provided inside the arithmetic processing unit for a high-speed response.

For example, Patent Document 1 discloses a structure in which a volatile memory such as an SRAM and a backup memory having higher data holding characteristics than the volatile memory are used in combination as a cache memory. In this structure, data in the volatile memory is backed up in the backup memory (backup) before power supply is stopped and the data is returned to the volatile memory (recovery) after power supply is restarted.

REFERENCE

Patent Document

[Patent Document 1] United States Patent Application Publication No. 2013/0232365

SUMMARY OF THE INVENTION

An object is to provide an arithmetic processing unit with low power consumption, a driving method thereof, the architecture thereof, or the like. Another object is to provide an arithmetic processing unit with stable data holding characteristics, a driving method thereof, the architecture thereof, or the like. Another object is to provide a novel arithmetic processing unit (or a novel electronic device), a driving method thereof, the architecture thereof, or the like. Another object(s) is one derived from the description of the specification, the drawings, the claims, and the like.

An arithmetic processing unit including even-numbered inverters in which each output is input directly or indirectly to the other inverter (or one of the other inverters), a transistor, a capacitor, a memory cell array in which memory cells are arranged in a matrix, and a backup and recovery driver (hereinafter, referred to as backup/recovery driver). In the memory cells, the even-numbered inverters each having an output that is directly or indirectly input to the capacitor via the transistor. The backup/recovery driver performs a first processing for transferring data from the capacitor to the even-numbered inverters and a second processing for transferring data from the even-numbered inverters to the capacitor. The backup/recovery driver does not perform the second processing and stops power supply to the memory cell array when data is not rewritten after the first processing in any memory cell in a first region of the memory cell array. The backup/recovery driver performs the second processing and stops power supply to the memory cell array when data is rewritten after the first processing in at least one memory cell in the first region of the memory cell array. A signal for identifying the first region of the memory cell array and a signal for instructing data writing to the memory cell array may be input to the backup/recovery driver. The backup/recovery driver is connected to a plurality of wirings which are connected to gates of the transistors in the memory cells, and the first processing and the second processing may be performed by changing potentials of the plurality of wirings. The transistor in the memory cell includes an oxide semiconductor, and the oxide semiconductor may include a channel formation region. The transistor in the memory cell includes a semiconductor film, and the semiconductor film may include a channel formation region. The backup/recovery driver includes an SR flip flop and an AOI gate. The output of the SR flip flop may be input to the AOI gate and the output of the AOI gate may determine the output of the backup/recovery driver.

A driving method of an arithmetic processing unit including even-numbered inverters in which each output is input directly or indirectly to the other inverter (or one of the other inverters), a transistor, a capacitor, and a memory cell array in which memory cells are arranged in a matrix. In the memory cells, the even-numbered inverters each having an output that is directly or indirectly input to the capacitor via the transistor. The driving method of the arithmetic processing unit includes a first process for transferring data from the capacitor to the even-numbered inverters and a process for stopping power supply to the memory cells after the first process. When any one of the memory cells in a first region is rewritten after the first process, power supply to the memory cell is stopped after a second process for transferring data from the even-numbered inverters to the capacitor. When any of the memory cells in the first region is not rewritten after the first process, the second process is not performed and power supply to the memory cells is stopped. The arithmetic processing unit may be configured to determine that data is rewritten in any of the memory cells in the first region when a signal for identifying the first region of the memory cell array and a signal for instructing data writing to the memory cell array are input at the same time. The first process and the second process may be performed by changing the potential of a gate of the transistor. Other embodiments may be claimed.

At least one of these objects can be solved: to provide an arithmetic processing unit with low power consumption, a driving method thereof, the architecture thereof, or the like, to provide an arithmetic processing unit with stable data holding characteristics, a driving method thereof, the architecture thereof, or the like, to provide a novel arithmetic processing unit (or a novel electronic device), a driving method thereof, the architecture thereof, or the like, an object derived from the description of the specification, the drawings, the claims, and the like.

BRIEF DESCRIPTION OF THE DRAWINGS

FIG. 2 illustrates a configuration example of a memory device.

FIGS. 13A and 13B each illustrate a configuration example of a memory device.

FIG. 18 illustrates a configuration example of a memory device.

FIGS. 21A and 21B illustrate an example of a cross-sectional structure of a memory device.

DETAILED DESCRIPTION OF THE INVENTION

Figure 1A:
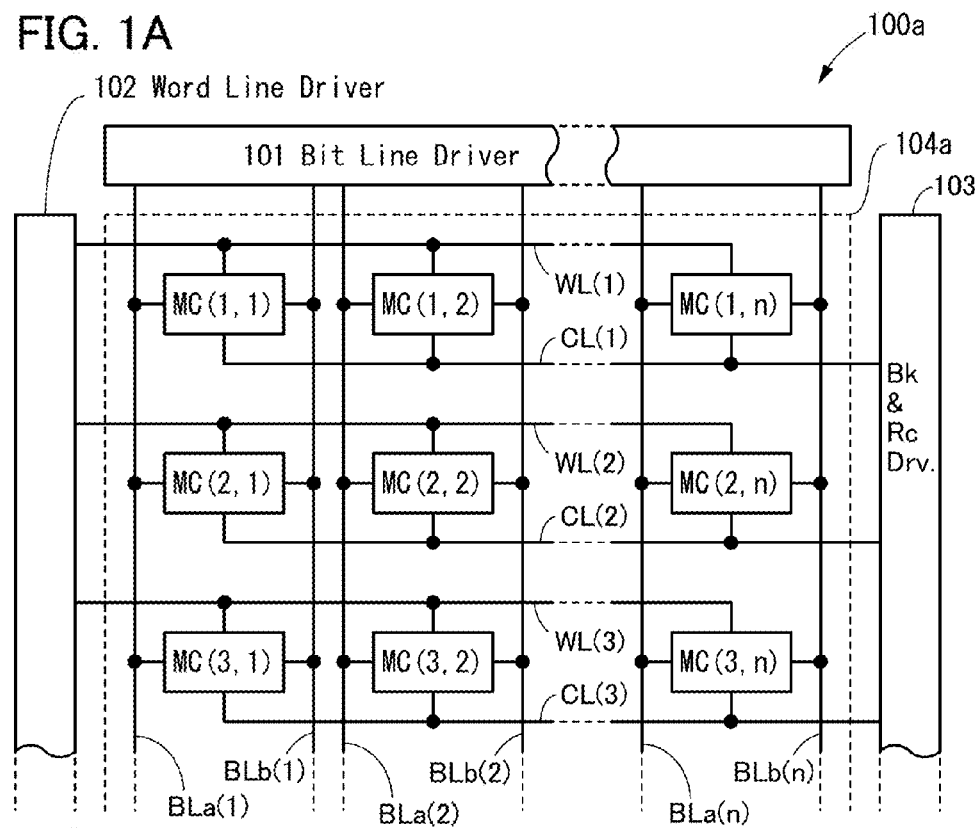
FIGS. 1A and 1B illustrate a configuration example of a memory device.

Hereinafter, embodiments of the present invention will be described in detail with reference to the accompanying drawings. Note that the present invention is not limited to the description below, and it is easily understood by those skilled in the art that a variety of modifications can be made to the modes and details without departing from the spirit and scope of the present invention. Therefore, the present invention should not be construed as being limited to the following description of the embodiments. Embodiments described below can be implemented in combination with any of the other embodiments as appropriate.

Note that in the following embodiments, the same portions or portions having similar functions are denoted by the same reference numerals in different drawings, and explanation thereof will not be repeated. "High" and "low" of signals can be reversed depending on the circuit configuration.

Embodiment 1

In this embodiment, a configuration example of a memory device is described with reference to FIGS. 1A to 16B and FIGS. 18 to 20C, and an example of a method for driving the memory device is described with reference to FIGS. 17A and 17B. The memory device of this embodiment can be used as a cache memory in an arithmetic processing unit, for example, and may be used in other devices. For example, the memory device can be used as a cache memory in a magnetic memory device, a cache memory in a flash memory, or a cache memory in a memory device in which a magnetic memory element and a semiconductor memory element such as a flash memory are combined.

FIG. 1A illustrates a structure of a memory device 100a. The memory device 100a includes a bit line driver 101, a word line driver 102, a backup/recovery driver 103, and a memory cell array 104a.

The bit line driver 101 is connected to a plurality of bit lines BLa (BLa(1), BLa(2), . . . , BLa(n) and the like) and a plurality of bit lines BLb (BLb(1), BLb(2), . . . , BLb(n) and the like) and outputs a signal to the bit lines BLa and the bit lines BLb. The word line driver 102 is connected to a plurality of word lines WL (WL(1), WL(2), WL(3), and the like) and outputs a signal to the word line WL. The backup/recovery driver 103 is connected to a plurality of control lines CL (CL(1), CL(2), CL(3), and the like) and outputs a signal to the control lines CL.

In the memory cell array 104a, memory cells MC (MC(1, 1), MC(2,1), MC(3,1), . . . , MC(1,2), MC(2,2), MC(3,2), . . . , MC(1,n), MC(2,n), MC(3,n)) are arranged in a matrix. Each memory cell MC is connected to the bit line BLa, the bit line BLb, the word line WL, and the control line CL.

Figure 1B:
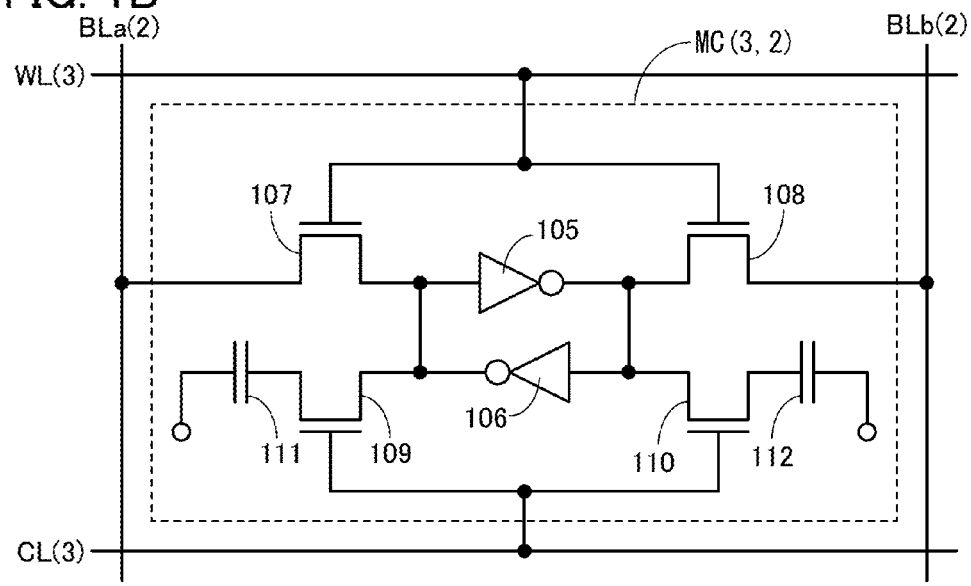

FIG. 1B is an example of a connection relationship and a circuit configuration of the memory cell MC (3, 2). The memory cell MC (3, 2) is connected to the bit line BLa (2), the bit line BLb(2), the word line WL(3), and the control line CL(3). The memory cell MC(3,2) includes an inverter 105, an inverter 106, an access transistor 107, an access transistor 108, a transistor 109, a transistor 110, a capacitor 111, and a capacitor 112. Other memory cells MC has the same structure.

A circuit including the inverters 105 and 106 and the access transistors 107 and 108 is used for a memory cell in a general SRAM. Note that another circuit configuration which is used for a memory cell in an SRAM can be used, and without limitation to an SRAM, a memory cell including a loop of a plurality of inverters can be used. A switch such as a transistor may be provided between inverters. The transistor 110 and the capacitor 112 may be omitted.

The memory cell MC(3,2) is a general SRAM cell further including the capacitors 111 and 112 in which the conduction between the capacitors 111 and 112 and the inverters 105 and 106 is controlled by the transistors 109 and 110 each having sufficiently high off-state resistance to hold or release electric charge accumulated in the capacitors 111 and 112. Each gate of the transistors 109 and 110 is connected to the control line CL, and the switching of the transistors 109 and 110 is controlled with the potential of the control line CL.

For example, when the inverters 105 and 106 are in a certain state, the transistor 109 is turned on, so that the potential of one electrode of the capacitor 111 on the transistor 109 side becomes close to an output potential of the inverter 106. The smaller the on-state resistance of the transistor 109 is and the smaller the capacitance of the capacitor 111 is, the faster the potential of the capacitor 111 becomes close to the output potential. In this manner, the output potential of the inverter 106 can be copied.

The transistor 109 is then turned off, and the potential of the electrode of the capacitor 111 on the transistor 109 side is held for a while. In the case of cutting the power of the inverter 106, for example, the output potential of the inverter 106 is changed and accordingly the potential of the electrode of the capacitor 111 on the transistor 109 side is changed. The larger the off-state resistance of the transistor 109 is and the larger the capacitance of the capacitor 111 is, the longer the time taken for the change is.

A transistor including a variety of oxide semiconductors described in Patent Document 1 can be used as the transistors 109 and 110, but without limitation, and other materials such as silicon may be used. A material which can be used is determined by the capacitance of the capacitors 111 and 112, the on-state resistance or the off-state resistance of the transistors 109 and 110, the ratio between the on-state resistance and the off-state resistance, or time allowed or limited by the operations of the memory device. A semiconductor film including a channel formation region is preferable because the off-state resistance can be increased and the on-state resistance is not increased so much.

In general, in a semiconductor material whose mobility is low, the on-state resistance is high and the off-state resistance is also high, and thus charge can be held for a longer time. When the ratio of the off-state resistance with respect to the on-state resistance is above a certain value, hold time can be increased longer enough than the time taken for backup or recovery which is described later.

Note that backup is not necessarily needed in all the memory cells MC. For example, in the case where data of a memory cell MC is not rewritten after recovery (such state can be referred to as clean state), data which is backed up last time is stored in the capacitors 111 and 112.

In contrast, in the case where data is rewritten even just once after recovery (such state is also referred to as dirty state), data stored in the capacitors 111 and 112 has a possibility to be different from the data which is backed up last time. Note that even in the dirty state, the data is the same as before in some cases.

When data is not rewritten at all after recovery in all the memory cells MC in one row (line), for example, backup is unnecessary for the data in that row because data backed up last time is stored in all the capacitors 111 and 112 in the memory cells MC in that row. The supply of signals to the control line CL in that row is thus unnecessary.

Because the total capacitance of the control lines CL is large, a large amount of charge needs to be transferred in order to raise and lower the potentials of all the control lines CL and power consumption is thus increased. Furthermore, large current flows instantaneously as time taken for the charge transfer is short.

The large current becomes a heavy load on the power source of the arithmetic processing unit, and voltage drop and the like may be caused. The large current can be a factor of backup failure or deformation or rupture of lines due to the large current.

Thus, it is effective to perform backup not in the entire memory cell array 104 but only in a required row or part, in terms of reduction in power consumption and prevention of instantaneous large current. Such a backup method is referred to as selective backup.

In the selective backup, the backup/recovery driver 103 supplies a signal to the control lines CL according to the rewrite state of the memory cell array 104a after the last recovery so that backup is performed only to a selected row or part where backup is needed.

Figure 3:
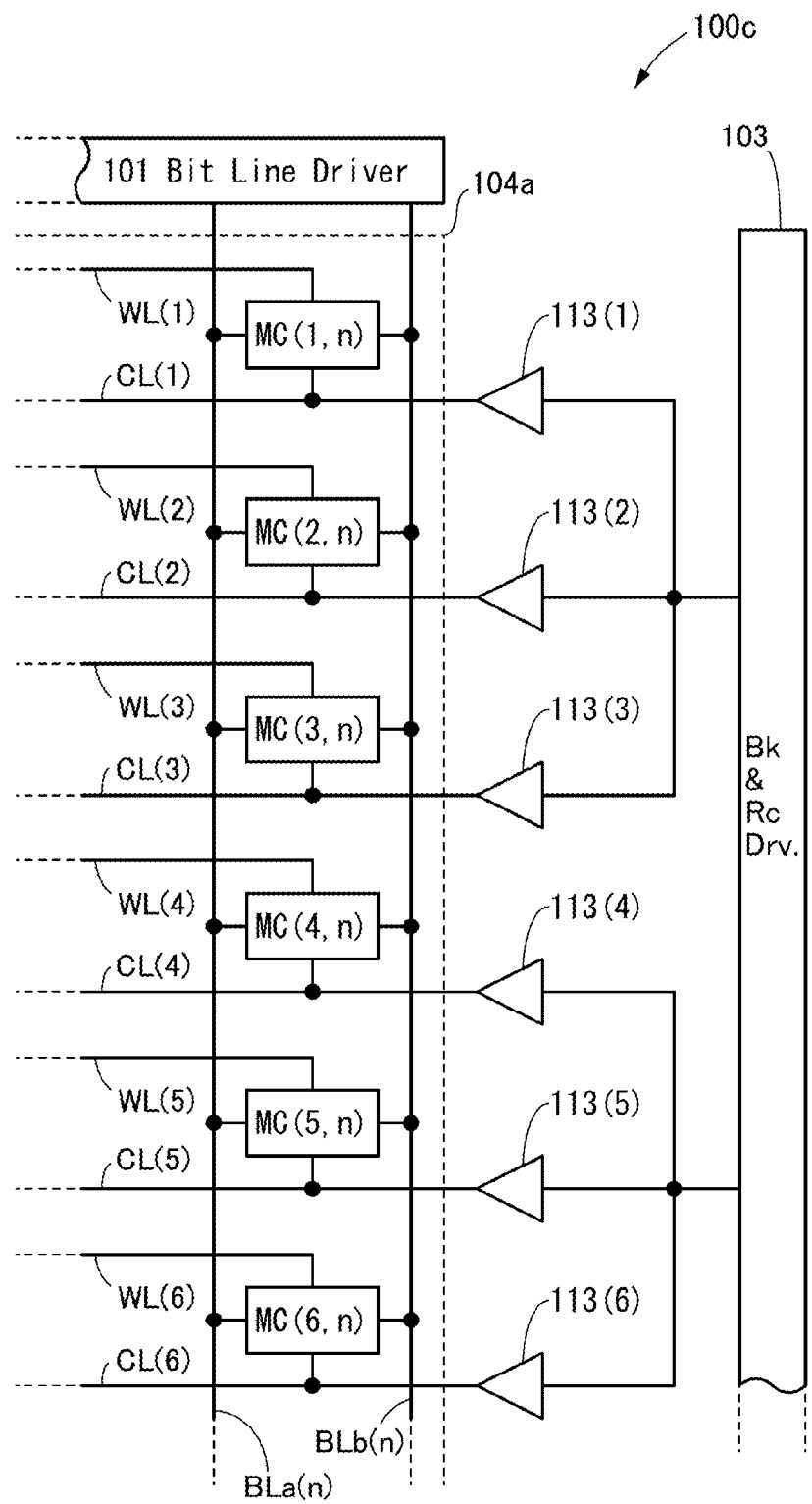
FIG. 3 illustrates a configuration example of a memory device.

FIG. 2 is another example of the memory device of this embodiment. A memory device 100b is configured to independently control groups of adjacent three control lines CL. That is, the memory cells MC in the first, second, and third rows are connected to the control lines CL(1), CL(2), and CL(3), respectively, and the memory cells MC in the fourth, fifth, and sixth rows are connected to the control lines CL(4), CL(5), and CL(6), respectively. In addition, the same signal is supplied to the control lines CL(1), CL(2), and CL(3), and the same signal is supplied to the control lines CL(4), CL(5), and CL(6). A memory device 100c shown in FIG. 3 is a modification example in which buffers 113 are provided between the backup/recovery driver 103 and the control lines CL.

In the memory devices 100b and 100c, when data is not rewritten after recovery in all the memory cells MC in the first to third rows, the backup/recovery driver 103 does not supply a signal to the control lines CL(1) to CL(3) in backup operation. Backup is thus not performed in the memory cells MC in the first to third rows. In contrast, when data is rewritten after recovery in at least one of the memory cells MC in the first to third rows, the backup/recovery driver 103 supplies a signal to the control lines CL(1) to CL(3) in backup operation.

Figure 4:
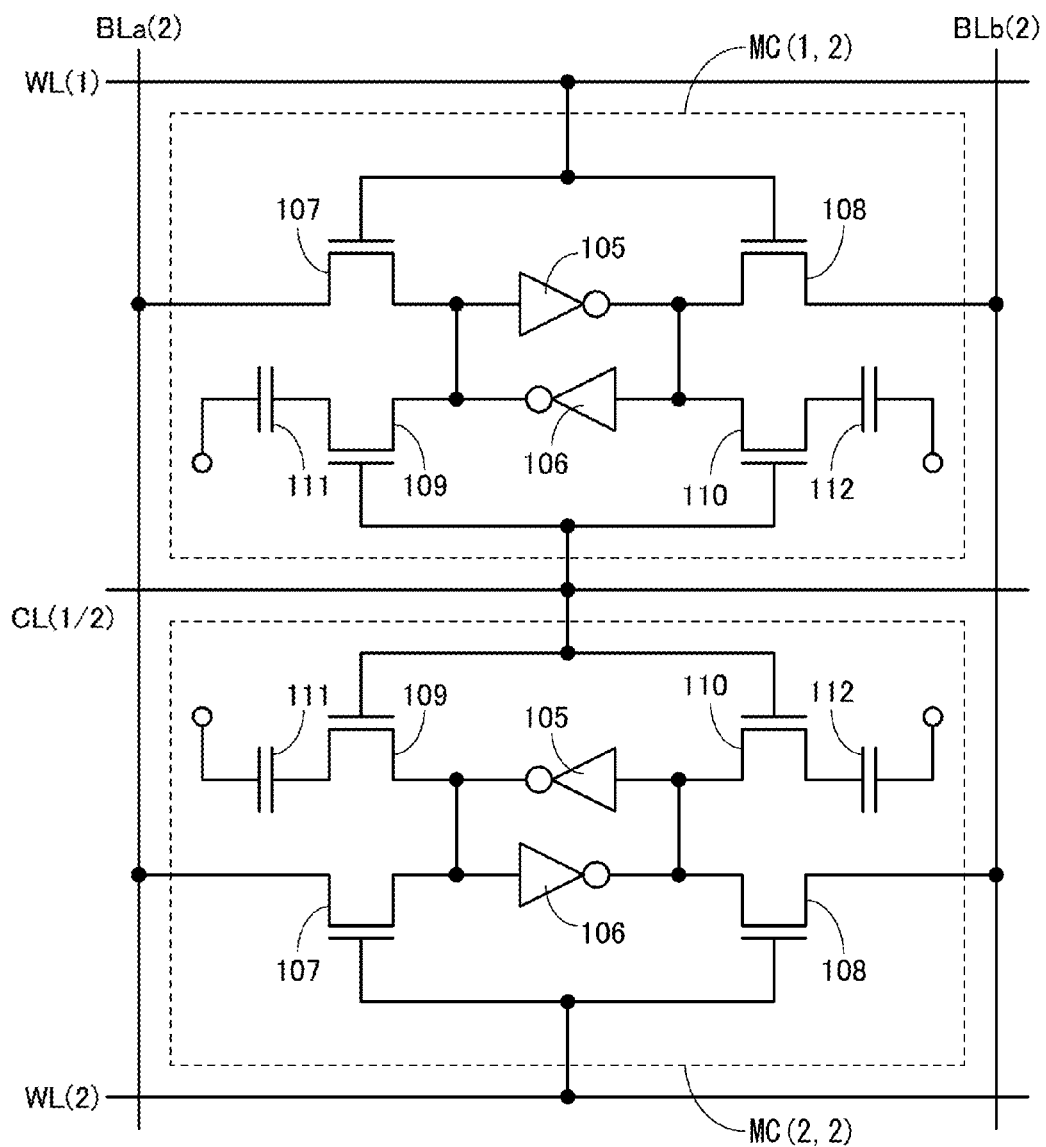
FIG. 4 illustrates a configuration example of a memory device.
Figure 5:
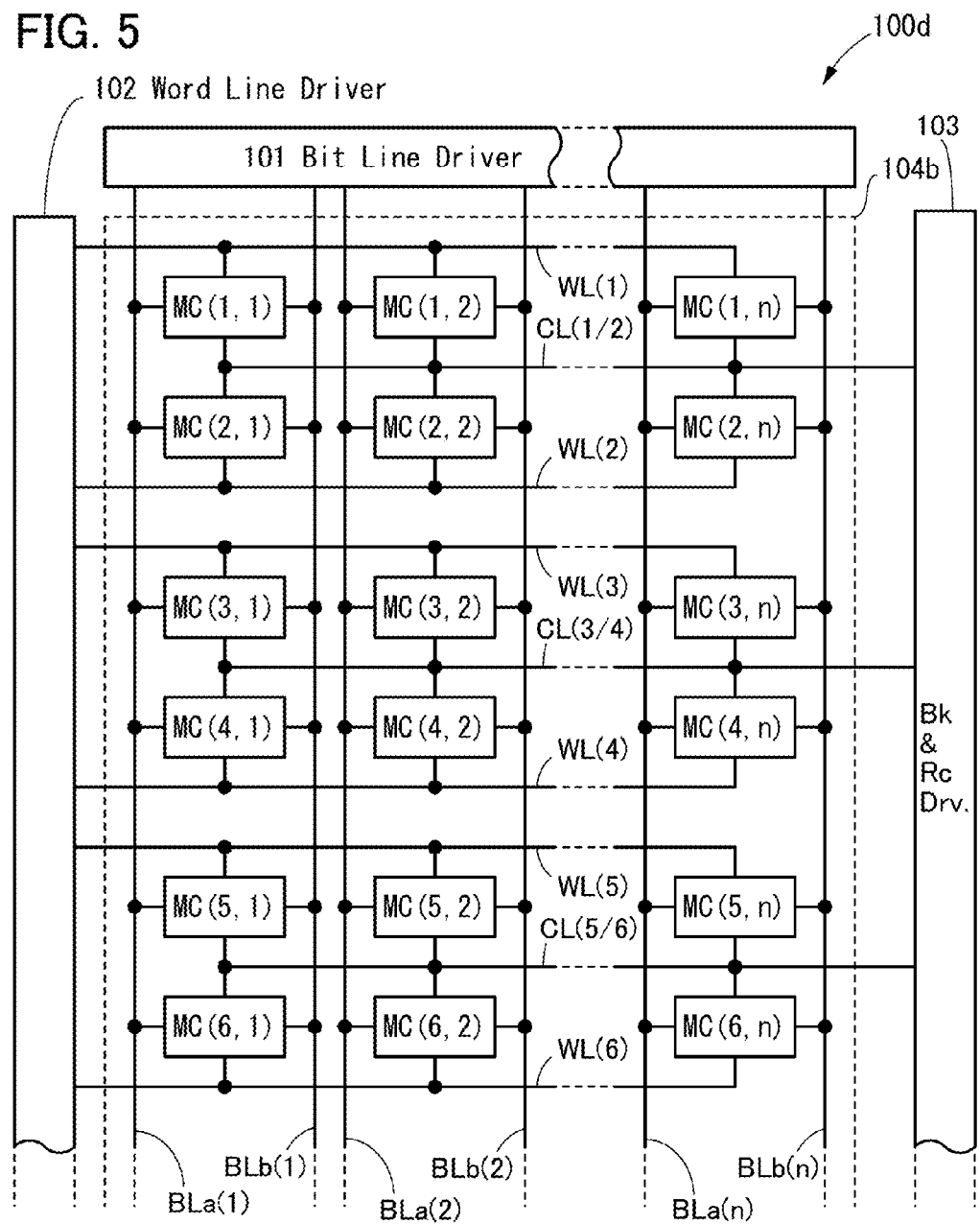
FIG. 5 illustrates a configuration example of a memory device.

Note that in order to improve integration, a control line CL may be shared by memory cells in adjacent two rows. For example, a control line CL(1/2) may be provided between the first row and the second row as shown in FIG. 4. FIG. 5 shows a memory device 100d including a memory cell array 104b using such a structure.

Figure 6A:
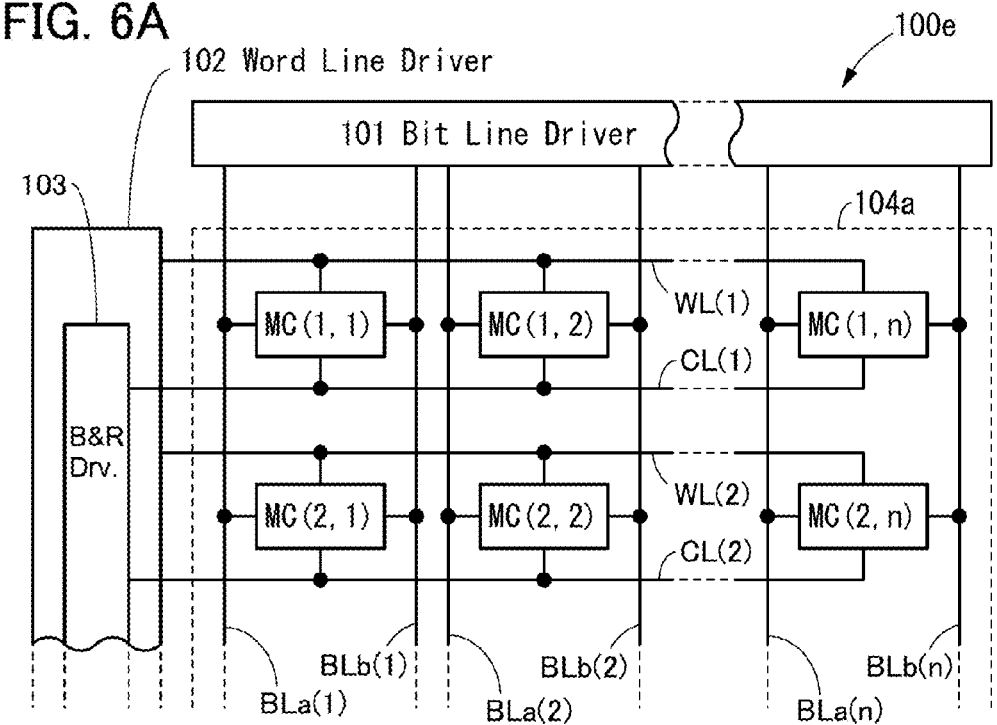
FIGS. 6A and 6B each illustrate a configuration example of a memory device.
Figure 6B:
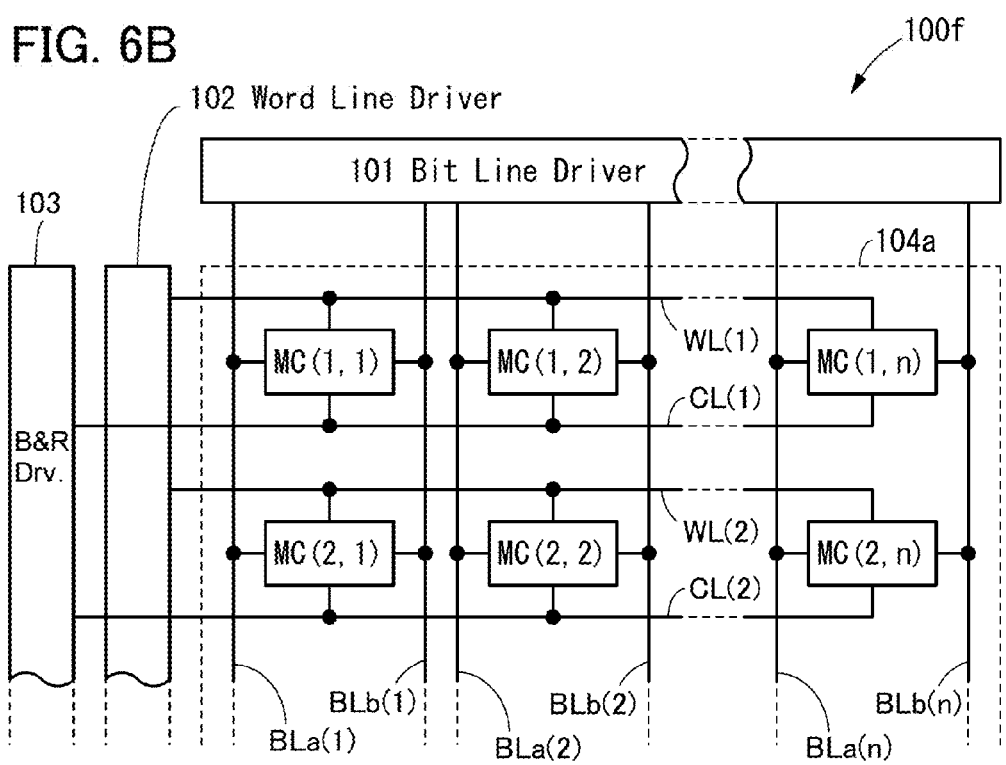

Note that the position of the backup/recovery driver 103 for controlling the plurality of control lines CL is not limited to the above. A memory device 100e in FIG. 6A and a memory device 100f in FIG. 6B are other examples. The backup/recovery driver 103 may be included inside the word line driver 102 as in FIG. 6A, outside the word line driver 102 as in FIG. 6B, between the word line driver and the memory cell array (not shown), or inside the memory cell array (not shown).

Figure 7A:
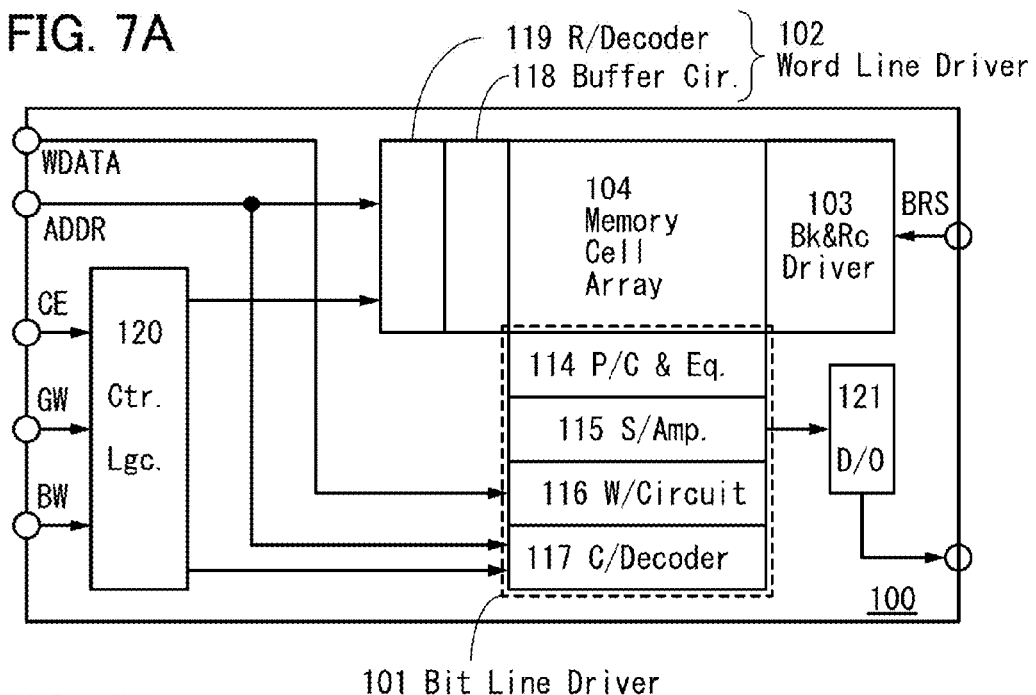
FIGS. 7A and 7B illustrate a configuration example of a memory device.

FIG. 7A is an example of (part of or a whole) signal path of the memory devices 100a to 100f and modification examples of them (hereinafter, referred to as memory device 100). The bit line driver 101 includes a precharge equalizer 114, a sense amplifier 115, a write circuit 116, and a column decoder 117. The word line driver 102 includes a buffer circuit 118 and a row decoder 119. The memory device 100 further includes a control logic circuit 120 and a data output circuit 121. Note that the memory cell array 104a or 104b or a modification example of them can be used as the memory cell array 104.

A write data WDATA, an address data ADDR, a chip enable signal CE, a global write enable signal GW, a byte write enable signal BW, and the like are input to the memory device 100. Among them, the chip enable signal CE, the global write enable signal GW, and the byte write enable signal BW are input to the control logic circuit 120. The signals processed in the control logic circuit 120 are not limited to them, and other control signals may be input as needed. The write data WDATA is input to the write circuit 116. The address data ADDR is input to the column decoder 117 and the row decoder 119. A backup/recovery signal BRS is input to the backup/recovery driver 103. The backup/recovery signal BRS may be input from a plurality of paths. Note that other signals such as a clock signal CLK may be input, and all of the above signals are not always necessary.

The control logic circuit 120 processes the chip enable signal CE, the global write enable signal GW, and the byte write enable signal BW, and outputs signals for controlling the column decoder 117 and the row decoder 119. The signals are input to the column decoder 117 and the row decoder 119. The bit line driver 101 supplies a signal to a bit line BLa and a bit line BLb, and the word line driver 102 supplies a word line WL signal according to these signals, the write data WDATA, and the address data ADDR. The backup/recovery driver 103 supplies a signal to the control line CL based on the backup/recovery signal BRS. The signal output from the sense amplifier 115 is output from the memory device 100 via the data output circuit 121.

Figure 7B:
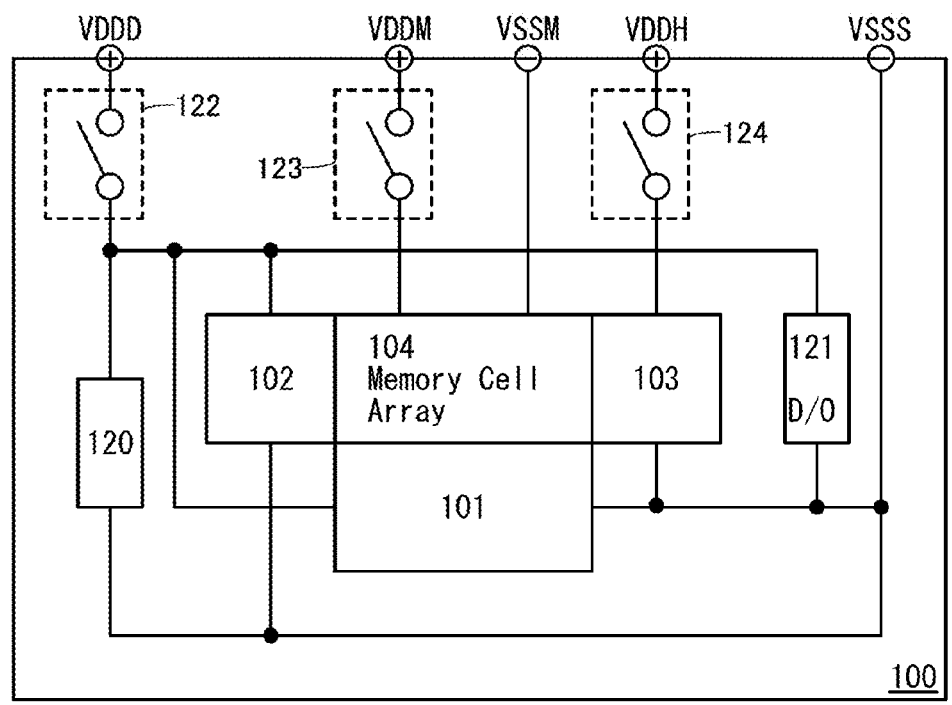

FIG. 7B shows an example of some or all power lines in the memory device 100. A potential VDDH, a potential VDDD, a potential VDDM, a potential VSSM (<the potential VDDM), and a potential VSSS (<the potential VDDD) are supplied to the memory device 100.

Note that VDDH>VDDD>VDDM>VSSM>VSSS is satisfied, for example. Here, a potential output from the inverter 106 is higher than the potential VSSM, whereas a potential of the control line CL for turning off the transistor 109 is approximately VSSS; thus, the off-state resistance of the transistor 109 can be increased as compared with the case where VSSM is equal to VSSS.

VDDD and VSSS are supplied to the bit line driver 101, the word line driver 102, the control logic circuit 120, and the data output circuit 121. VDDH and VSSS are supplied to the backup/recovery driver 103. VDDM and VSSM are supplied to the memory cell array 104.

A power gating switch 122, a power gating switch 123, and a power gating switch 124 are respectively provided between a terminal for supplying VDDD, the bit line driver 101, the word line driver 102, the control logic circuit 120, and the data output circuit 121, between a terminal for supplying VDDM and the memory cell array 104, and between a terminal for supplying VDDH and the backup/recovery driver 103. Some or all the switches are turned off while reading data or writing data from/into the memory cell array 104 is not necessary (while the memory cell array is not accessed from outside), reducing power consumption.

Figure 9:
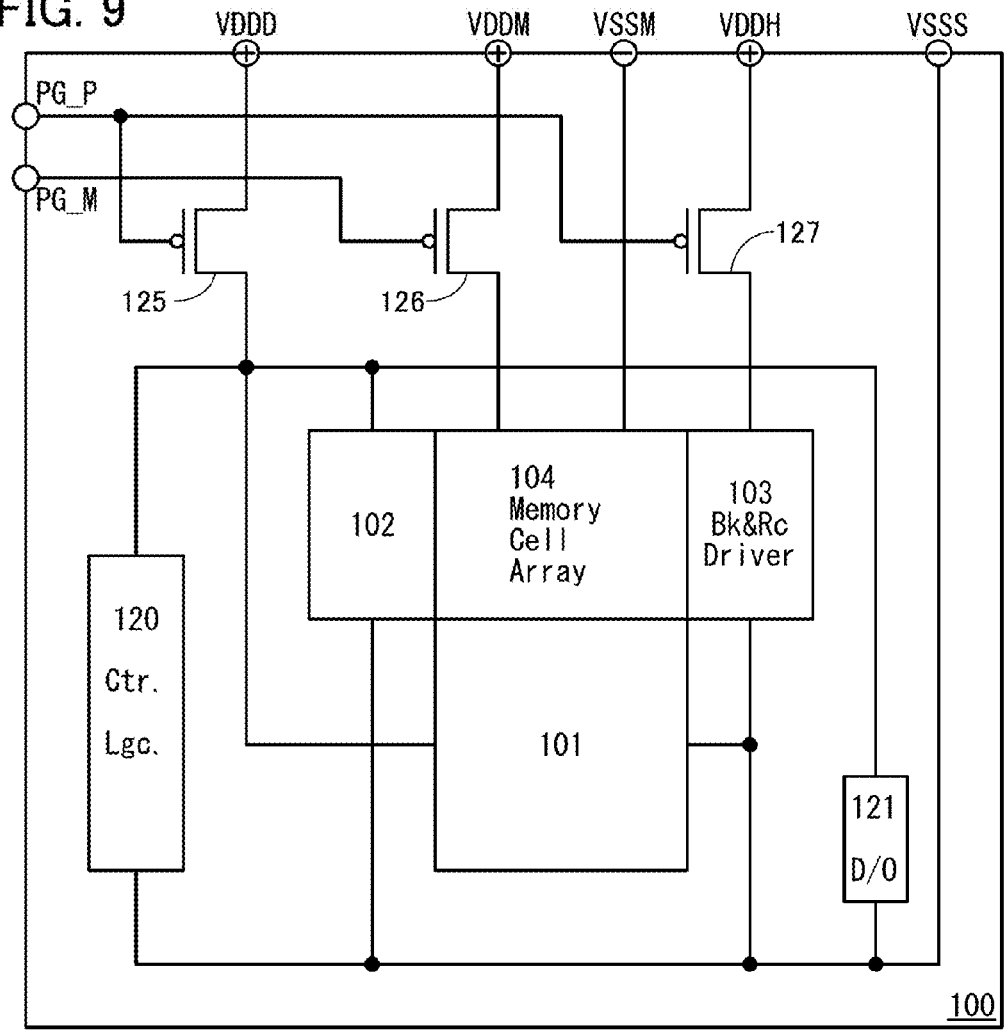
FIG. 9 illustrates a configuration example of a memory device.

FIG. 9 is an example in which a p-channel transistor is used as each of power gating transistors 125, 126, and 127 corresponding to the power gating transistors 122, 123, and 124. A power gating signal PG_P is supplied to each gate of the power gating transistors 125 and 127, and a power gating signal PG_M is supplied to a gate of the power gating transistor 126 to switch on or off the power gating transistors 125, 126, and 127.

Because the off-state resistance of the power gating transistors 125, 126, and 127 is sufficiently high, when one or more of the power gating transistors 125, 126, and 127 is turned off, potential(s) corresponding to one or more circuit(s) become substantially VSSS or VSSM in the description below.

Note that each of the power gating switches 122, 123, and 124 may include a plurality of switches which are independently controlled. For example, the memory cell array 104 is divided into some parts and a plurality of power gating switches 123 is provided to control power supply to each part.

Figure 8A:
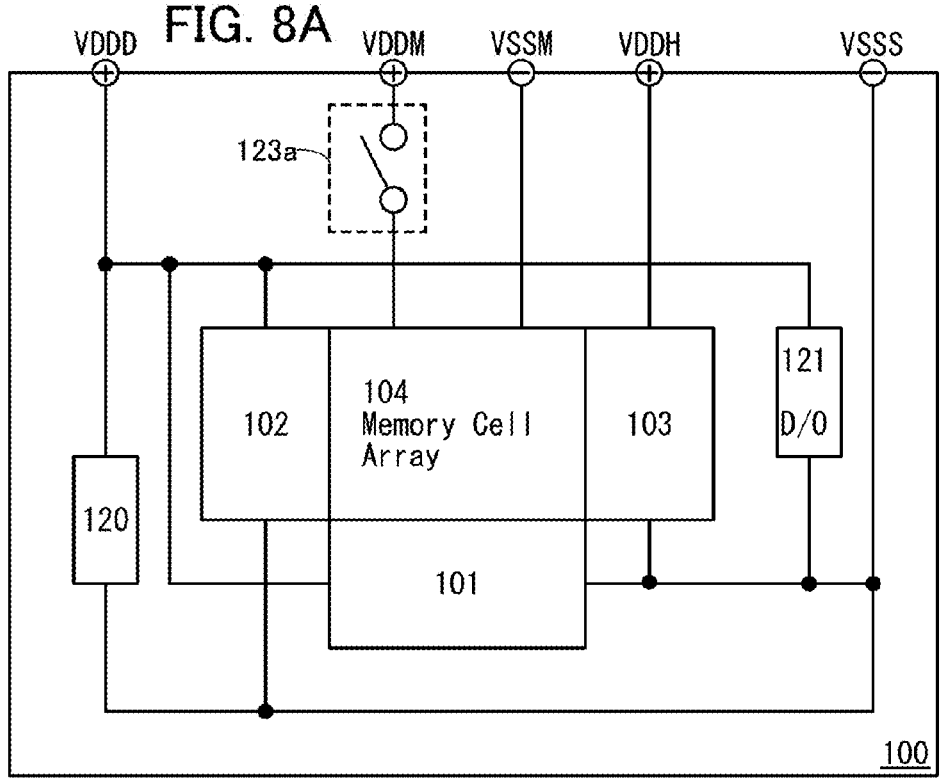
FIGS. 8A and 8B illustrate a configuration example of a memory device.
Figure 8B:
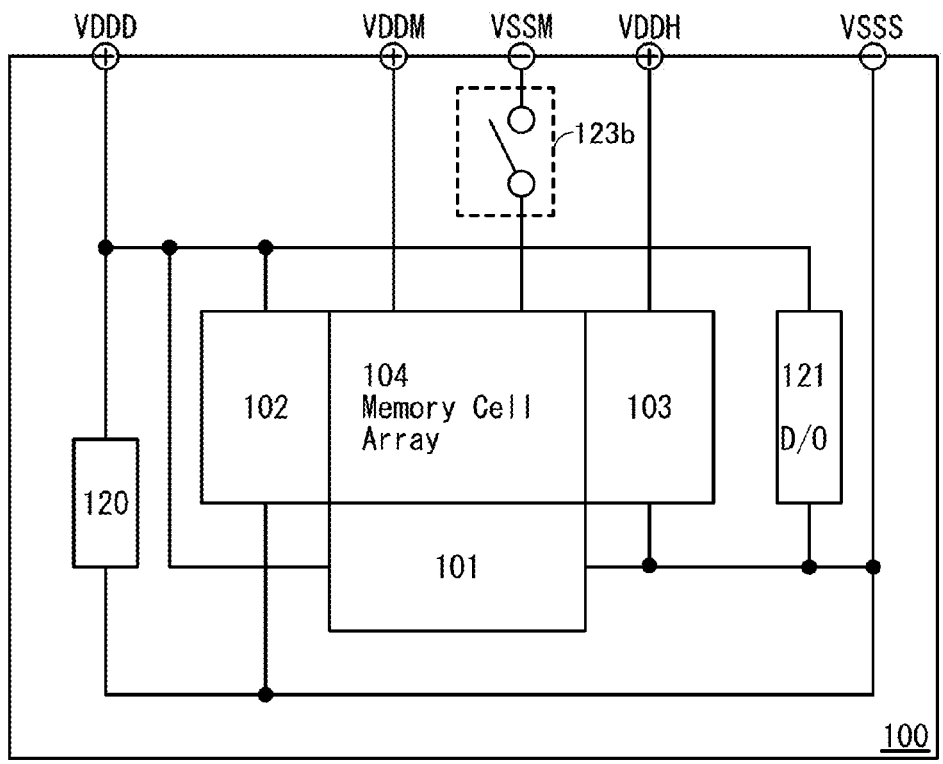

FIG. 8A is an example including only a power gating switch 123a and not including the power gating switches 122 and 124. FIG. 8B is another example including only a power gating switch 123b between a terminal for supplying VSSM and the memory cell array 104.

Figure 10:
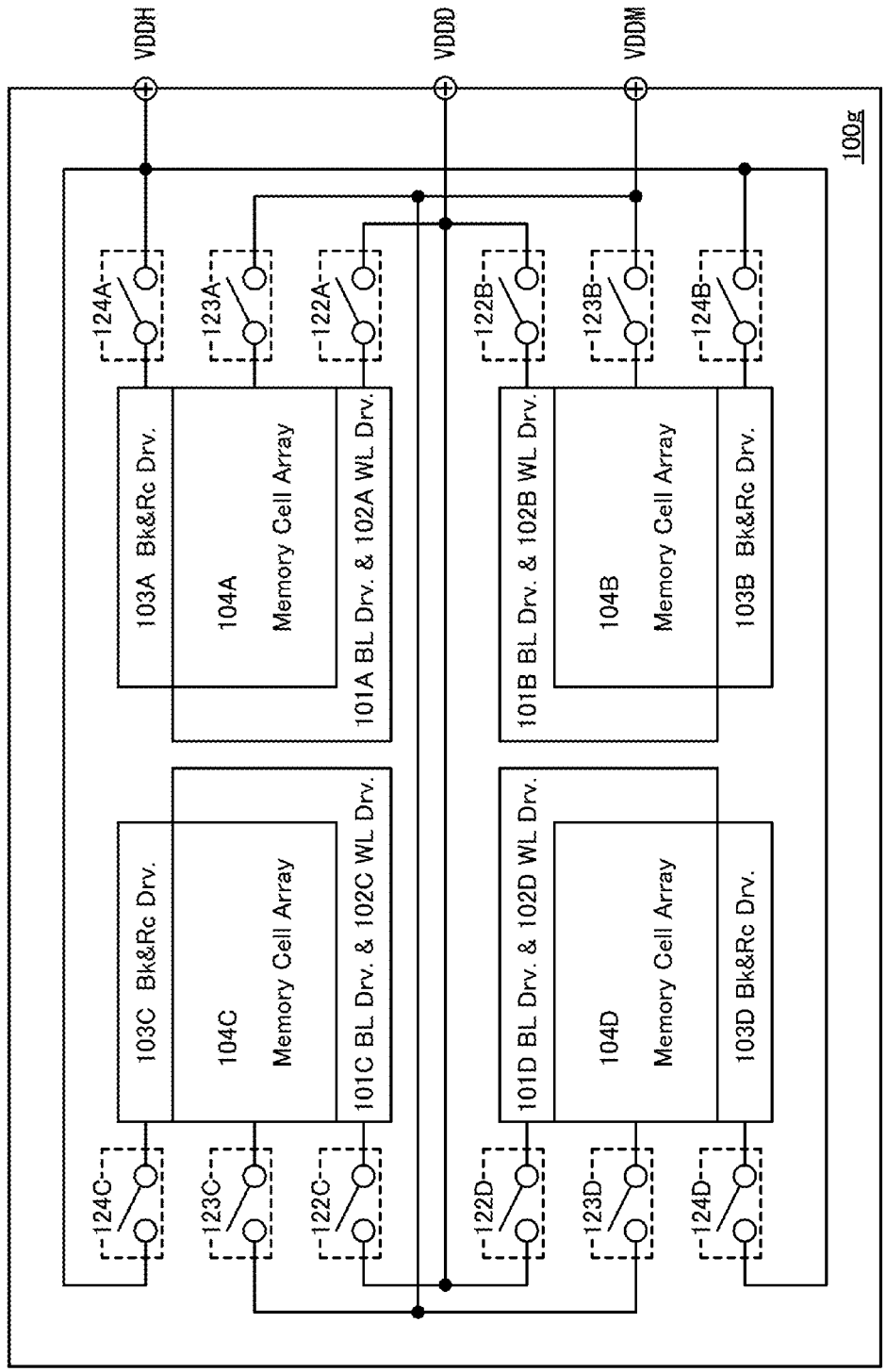
FIG. 10 illustrates a configuration example of a memory device.

An arithmetic processing unit may include a plurality of memory cell arrays. FIG. 10 shows a memory device 100g including four memory cell arrays (memory cell arrays 104A to 104D). The memory cell arrays 104A to 104D respectively include bit line drivers 101A to 101D, word line drivers 102A to 102D, backup/recovery drivers 103A to 103D, and the like. The number of memory cell arrays may be two or more without limitation to four.

The bit line driver 101, the word line driver 102, the backup/recovery driver 103, the memory cell array 104, or the modifications thereof can be used. The unit also includes a circuit needed for operation of the memory cell array, a circuit needed for accompanying operation of circuits, and the like (not illustrated, see FIG. 7A).

The four memory cell arrays and the circuits included in them include power gating switches 122A to 122D, 123A to 123D, and 124A to 124D. For example, the power gating switches 122A to 122D control power supply to the bit line drivers 101A to 101D and the word line drivers 102A to 102D. The power gating switches 123A to 123D respectively control power supply to the memory cell arrays 104A to 104D. The power gating switches 124A to 124D respectively control power supply to the backup/recovery drivers 103A to 103D.

Note that a potential VSSS and a potential VSSM which are lower are also supplied to the memory device 100g in addition to VDDH, VDDD, and VDDM (not shown in FIG. 10). FIG. 7B can be referred to for the potentials supplied to the memory device 100g.

In the memory device 100g, backup in the memory cell arrays 104A to 104D can be performed in such a manner that only data of a memory cell array including memory cells whose data is rewritten after recovery (only a dirty memory cell array) is backed up.

Because a cache memory has time and spatial locality in general, which part of data to be rewritten can be identified when time is limited in a short period. Data to be rewritten part can be limited in a certain region.

For this reason, the frequency of occurrence of the case where only one of the memory cell arrays 104A to 104D is rewritten (this memory cell array is called a dirty memory cell array) and the other three is not rewritten at all (they are called clean memory cell arrays) after recovery is very high, especially in lower cache memories (e.g., L2 and L3). In that case, backup is performed only in the dirty memory cell array and thus a required power for driving control lines CL can be almost a quarter of that in the case where backup is performed in all the memory cell arrays.

In an L1 cache memory, a register, or the like, rewriting might be performed frequently over the entire region, and cannot be performed at the row level in many cases, in which case it is preferable to determine whether to perform backup in each row.

Details of the backup/recovery driver 103 will be described. As described above, the backup/recovery driver 103 determines whether to perform backup on a row, group of rows, or larger unit (a subarray or a memory cell array) basis depending on whether the row or the larger unit is clean or dirty. This operation may be performed using a circuit (hardware) or software.

Figure 11A:
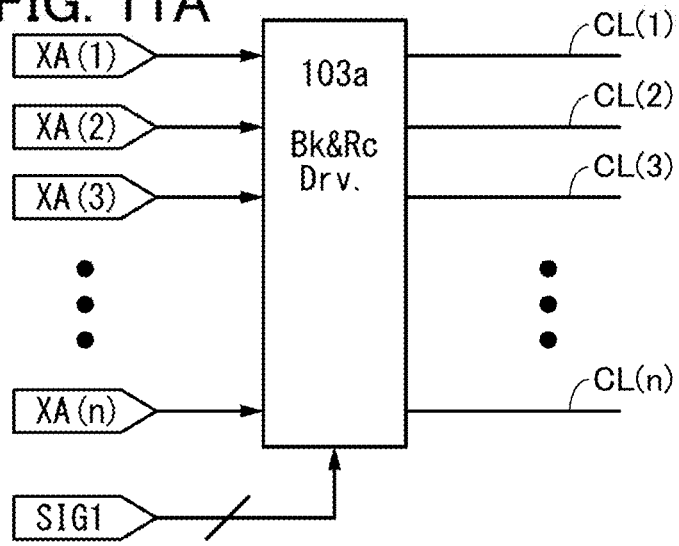
FIGS. 11A and 11B each illustrate a configuration example of a memory device.

A signal SIG1 and signals XA(1) to XA(n) which can identify a selected position or part where backup is performed are directly or indirectly input to a backup/recovery driver 103a shown in FIG. 11A. As the signal SIG1 and the signals XA(1) to XA(n), a signal which is input to another circuit such as a memory and appropriately processed, and input to the backup/recovery driver 103a may be used.

As the signal XA, an output potential of a word line, a row address signal RA described later, a subarray select signal SEL, or the like can be used. The signal SIG1 contains information on backup, recovery, and data rewriting and may be input through a plurality of paths. Examples of the signal SIG1 is a write enable signal WE, a backup/recovery signal BRS, and the like.

Note that the signal XA may contain information on data rewriting. In the case of an SRAM cell in which reading operation and writing operation use different word line to transmit signals, for example, a signal of a word line through which a signal is transmitted only in writing may be XA. In that case, the signal SIG1 does not need to contain information on data rewriting.

The backup/recovery driver 103a holds the signals inside or outside and supplies a potential for backup to the control lines CL(1) to CL(n) where backup is required.

Figure 11B:
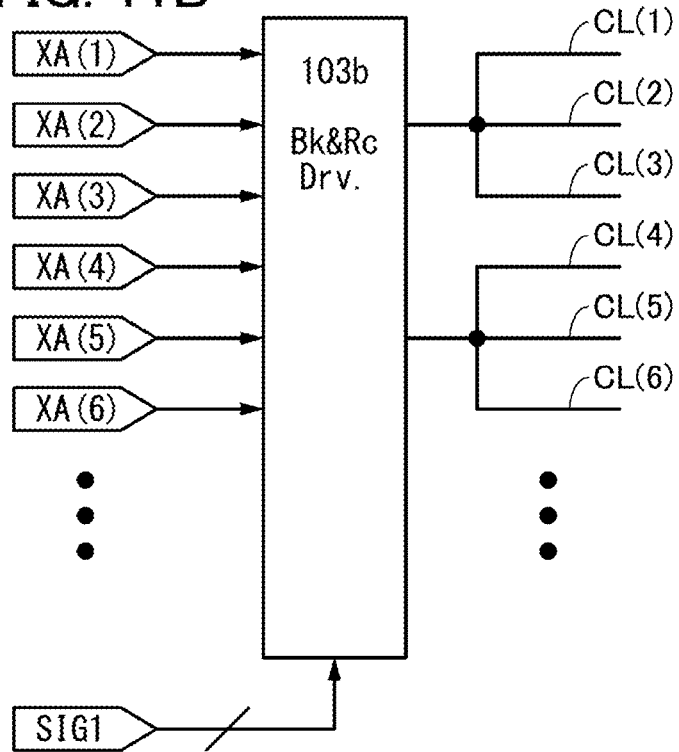

The backup/recovery driver 103a shown in FIG. 11A includes one output for one signal XA, whereas a backup recover driver 103b shown in FIG. 11B includes one output for a plurality of signals XA. In the backup/recovery driver 103b, one output is provided for three signals XA (e.g., signals XA(1) to XA(3)) and is divided into three to the control lines CL(1) to CL(3).

Figure 12A:
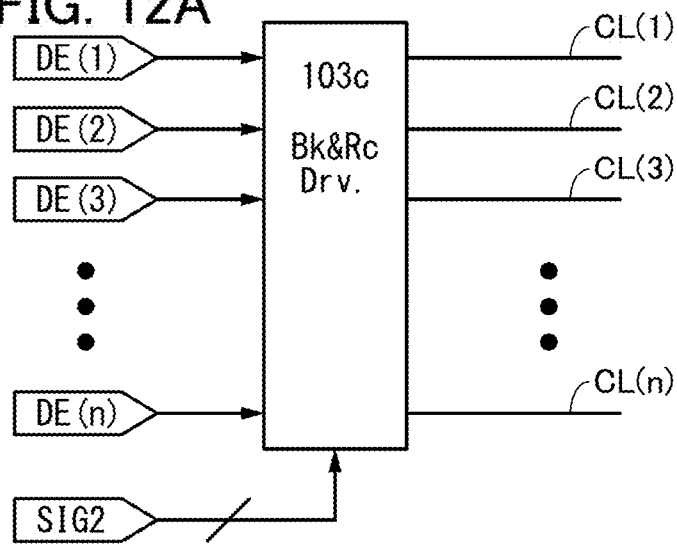
FIGS. 12A and 12B each illustrate a configuration example of a memory device.

A backup/recovery driver 103c shown in FIG. 12A includes a memory inside and is supplied with dirty enable signals DE(1) to DE(n) in the first row to the n-th row. The dirty enable signal DE goes high when data is rewritten or the same data is overwritten after recovery in memory cells MC in a row (or in a larger unit), that is, the memory cells become dirty. The dirty enable signal DE goes high several times after recovery in some cases.

A signal SIG2 is also input to the backup/recovery driver 103c. The signal SIG2 relates to operation of the backup/recovery driver 103c and may be input through a plurality of paths. For example, the backup/recovery signal BRS is included.

The backup/recovery driver 103c holds the dirty enable signals DE(1) to DE(n) and supplies a potential required for backup to the control lines CL(1) to CL(n) according to the signal SIG2, that is, supplies a potential for turning on the transistor 109 or 110 to a control line CL in a row (or in a larger unit) where the dirty enable signal DE goes high even just once after recovery.

Data based on the dirty enable signals DE(1) to DE(n) which are held in the backup/recovery driver 103c is erased (reset) in the intervals between the recovery and a normal operation after the backup.

Figure 12B:
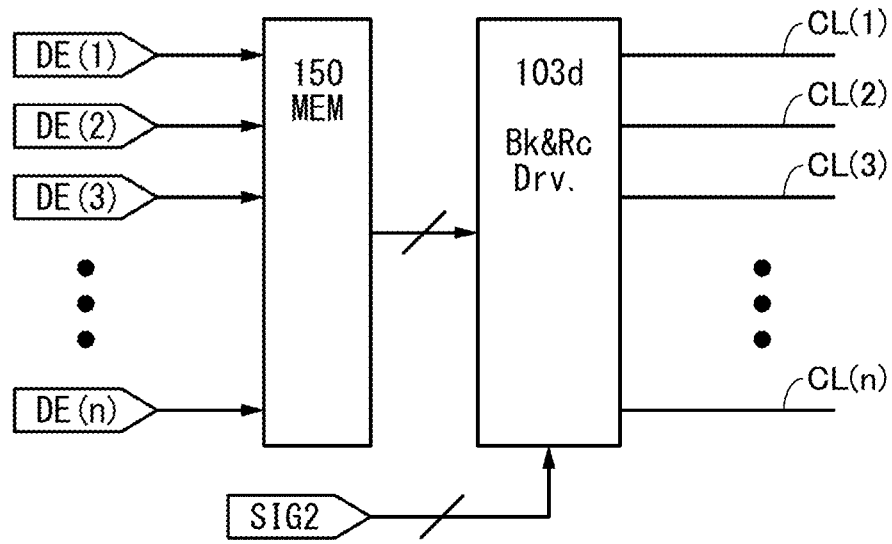

FIG. 12B shows a backup/recovery driver 103d and a memory 150 outside the backup/recovery driver 103d. The memory 150 holds data based on the dirty enable signals DE(1) to DE(n), and the backup/recovery driver 103d supplies a required potential to the control lines CL(1) to CL(n) according to the data and the signal SIG2. The memory 150 may be part of the memory cell array 104, for example.

The dirty enable signals DE(1) to DE(n) which are held in the memory 150 is erased in the intervals between the recovery and a normal operation after the backup.

In the case where the memory 150 has a structure in which data of a bit group in one column in the memory cell array 104 is not backed up, when the memory cell array 104 is powered off after backup of other memory cells MC, the data in the bit group is automatically erased.

Any data (e.g., data "0") is automatically written in recovery, and another data (e.g., data "1") is automatically written and held when the dirty enable signal DE is input.

FIG. 13A shows a backup/recovery driver 103e as an example of the backup/recovery driver 103c. The backup/recovery driver 103e includes backup/recovery output circuits 151(1) to 151(n) in respective rows (or respective larger units).

The dirty enable signals DE(1) to DE(n) are respectively input to and held in the backup/recovery output circuits 151(1) to 151(n).

The backup enable signal BKE and the recovery enable signal RCE which are part of or the whole backup/recovery signal BRS are input to the backup/recovery output circuits 151(1) to 151(n).

The backup/recovery output circuits 151(1) to 151(n) are respectively connected to the control lines CL(1) to CL(n).

Note that booster circuits 152 or other circuits may be provided between the backup/recovery output circuits 151 and the control lines CL like a backup/recovery driver 103f in FIG. 13B.

Figure 14A:
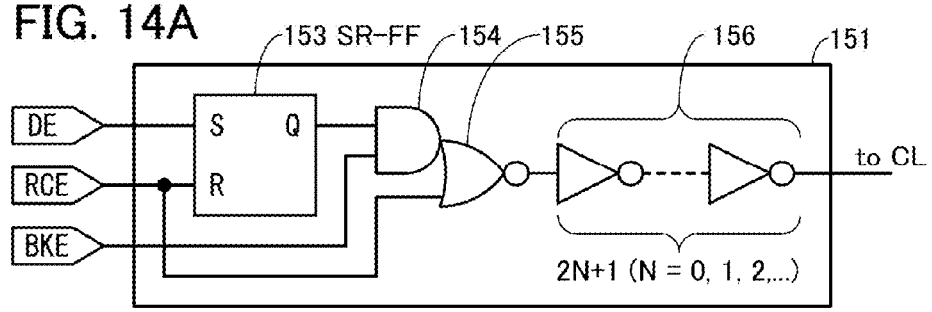
FIGS. 14A to 14E illustrate configuration examples of a memory device.

FIG. 14A is an example of the backup/recovery output circuit 151. The backup/recovery output circuit 151 includes an SR flip flop 153, an AND gate 154, a NOR gate 155, and odd inverters 156 which are connected in series. An AOI (AND-OR-Invert) gate is composed of the AND gate 154 and the NOR gate 155.

The dirty enable signal DE and the recovery enable signal RCE are input to a terminal S and a terminal R, respectively, of the SR flip flop 153. Because of the circuit characteristics, the dirty enable signal DE and the recovery enable signal RCE do not get high at the same time, and also the backup enable signal BKE and the recovery enable signal RCE do not get high at the same time.

Focusing on the latter characteristic, an XOR gate or an XNOR gate can be used instead of the NOR gate 155. Note that the number of the inverters 156 is zero or an even number in the case of using an XOR gate (see FIG. 15A).

Figure 15A:
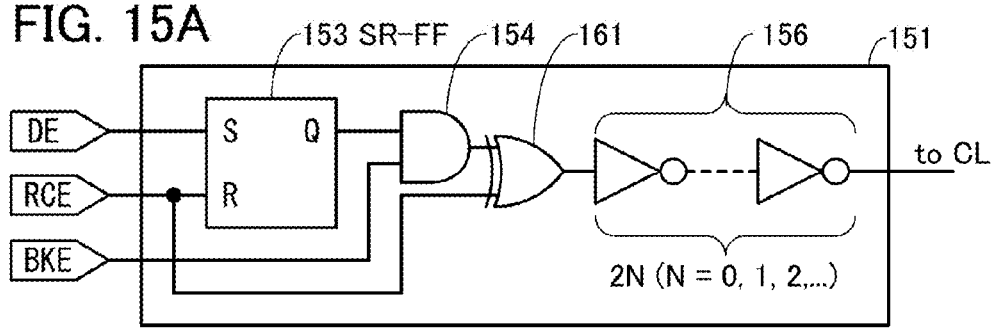
FIGS. 15A and 15B illustrate a configuration example of a memory device.
Figure 15B:
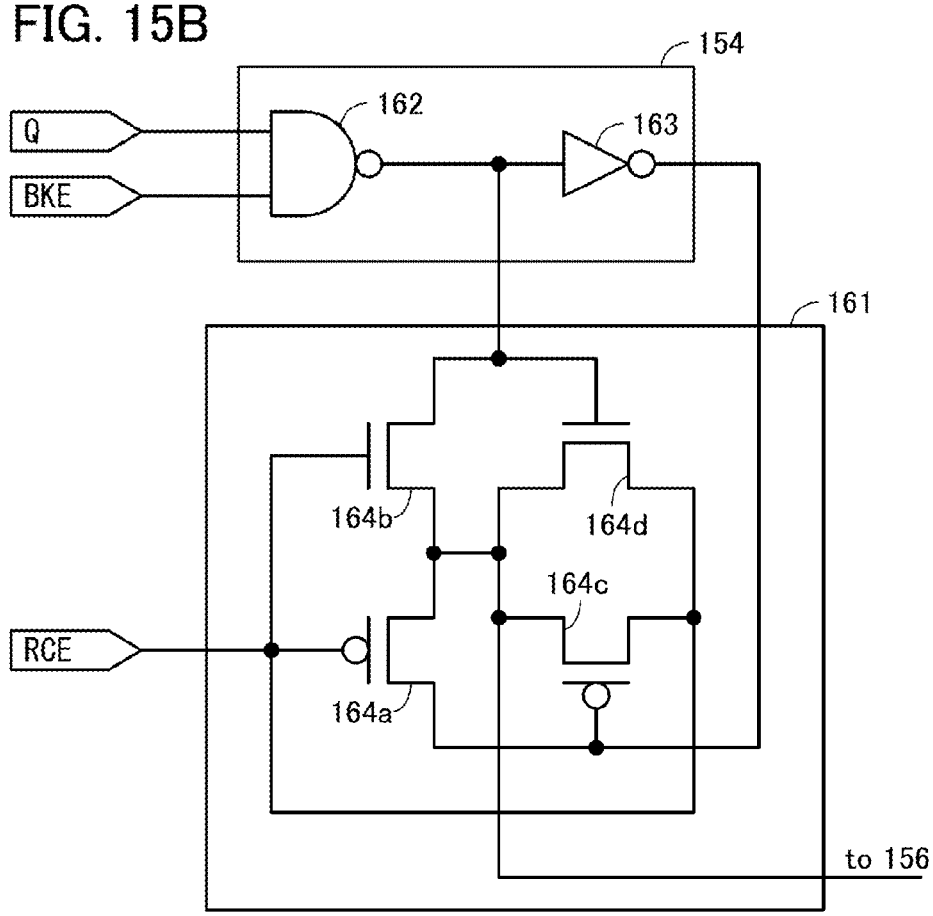

In general, the AND gate 154 includes the NAND gate 162 and the inverter 163 connected in series as shown in FIG. 15B, and an output signal of the NAND gate 162 corresponds to an inverted signal of an output signal of the inverter 163. These signals may be used as input signals of the XOR gate.

FIG. 15B shows an XOR gate 161 including a P-channel transistor 164, an N-channel transistor 164b, a P-channel transistor 164c, and an N-channel transistor 164d. An inverter, which is necessary in a common XOR gate, becomes unnecessary in the XOR gate 161 in FIG. 15B because not only the recovery enable signal RCE and an output signal of the AND gate 154 but also an inverted signal of the output signal of the AND gate 154 are input.

In FIG. 14A, the AND gate 154 outputs high when both of the backup enable signal BKE and the output of the SR flip flop 153 are high. Note that this function can be achieved by a circuit other than an AND gate.

For example, the SR flip flop 153 is configured to output low when dirty and output high when clean, and the output of the SR flip flop 153 and an inverted signal of the backup enable signal BKE (i.e., a signal which is normally high and changes to low in backup) are input to an NOR gate.

Furthermore, in FIG. 14A, either the recovery enable signal RCE or the output of the AND gate 154 goes high by the NOR gate 155 and the output of the NOR gate 155 becomes low. Such a function can be performed in a circuit other than an NOR gate; for example, an XOR gate can be used instead of an NOR gate as described above.

The backup/recovery output circuit 151, in general expression, includes a first circuit to which the output of the SR flip flop 153 (or a circuit having an equivalent function) and the backup enable signal BKE or an inverted signal thereof are input and a second circuit to which the output of the first circuit and the recovery enable signal RCE or an inverted signal thereof are input. The first circuit and the second circuit can achieve at least one of OR logic, NOR logic, AND logic, NAND logic, XNOR logic, and XOR logic.

The backup/recovery output circuit 151 may include a three-input logic circuit satisfying a truth table shown in Table 1 or the derivative thereof (described later).

SR-FF in the table means the output signal of the SR flip flop 153 shown in FIG. 14A. Here, "1" and "0" mean dirty and clean, respectively. BKE means the backup enable signal BKE, and "1" denotes that backup is performed and "0" denotes other cases. BKE means the recovery enable signal RCE, and "1" denotes that recovery is performed and "0" denotes other cases.

TABLE 1

| SR-FF | BKE | RCE | OUT_A | OUT_B |
|-------|-----|-----|-------|-------|
| 0 | 0 | 0 | 0 | 1 |
| 0 | 0 | 1 | 1 | 0 |
| 0 | 1 | 0 | 0 | 1 |
| 0 | 1 | 1 | any | any |
| 1 | 0 | 0 | 0 | 1 |
| 1 | 0 | 1 | 1 | 0 |
| 1 | 1 | 0 | 1 | 0 |
| 1 | 1 | 1 | any | any |

In Table 1, OUT_A and OUT_B are both an output signal of the three-input logic circuit, and OUT_B is an inverted signal of OUT_A. Either OUT_A or OUT_B may be output. Note that "any" means that either "1" or "0" is possible. This is because the backup enable signal BKE and the recovery enable signal RCE do not get high at the same time as described above, and there is no point in considering a combination of high BKE and high RCE.

For example, the AOI gate in FIG. 14A satisfies OUT_B in Table 1. When the backup enable signal BKE and the recovery enable signal RCE are both "1", OUT_B is "0". Note that OUT_B here can be either "1" or "0" as described above, and a logic gate from which OUT_B is obtained is not limited to the AOI gate.

The true table in Table 1 and the derivative can also be achieved using a multiplexer without limitation to a logic gate.

Figure 16A:
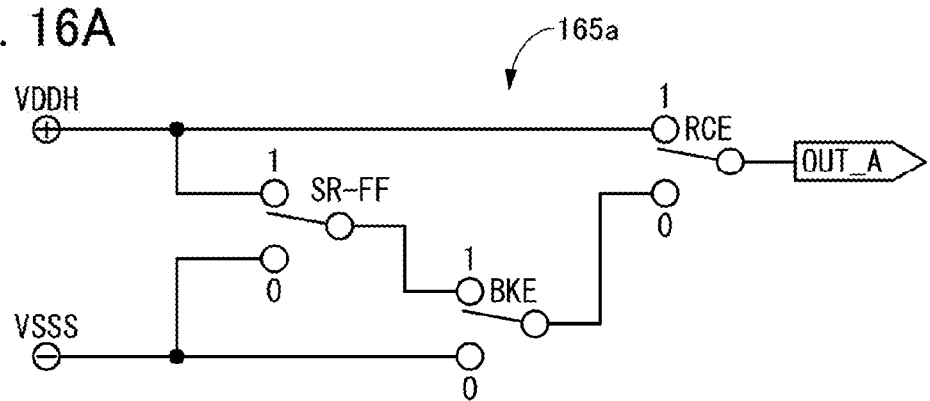
FIGS. 16A and 16B each illustrate a configuration example of a memory device.
Figure 16B:
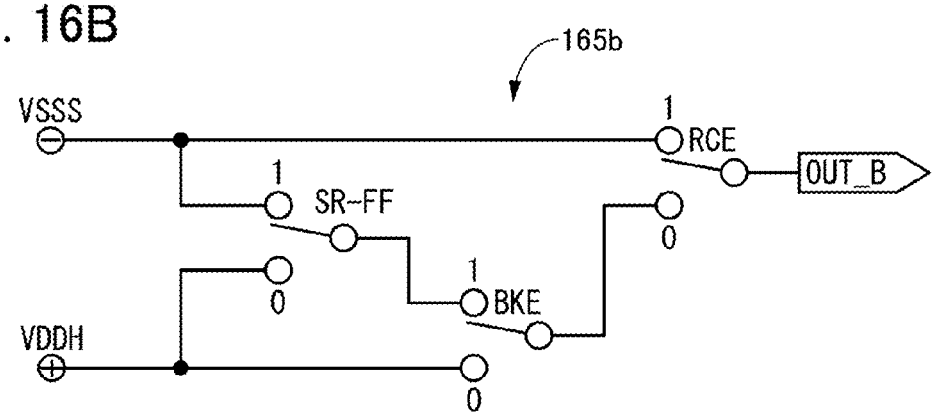
Figure 17A:
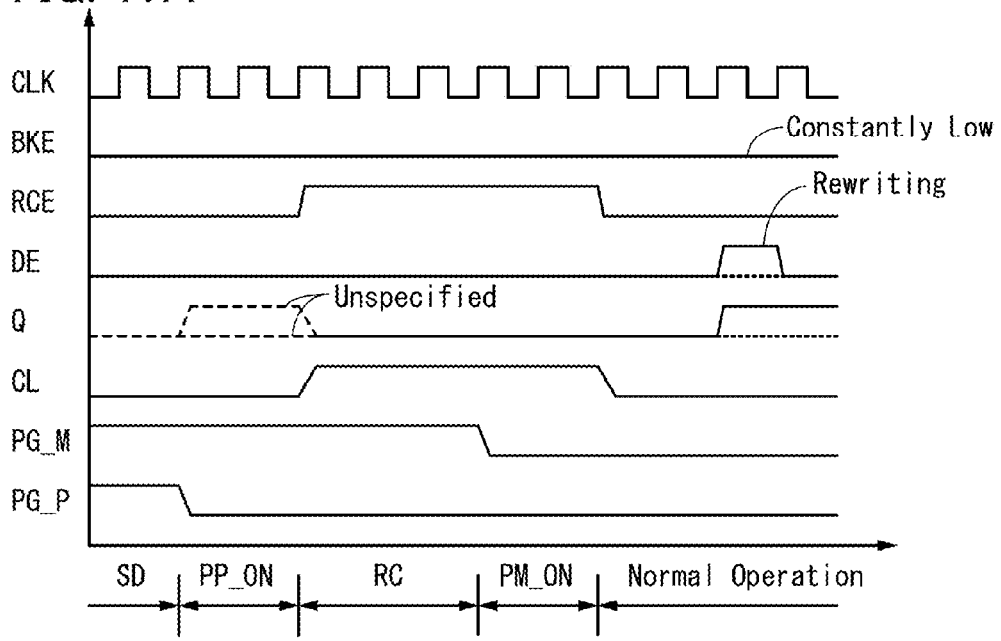
FIGS. 17A and 17B show an operation example of a memory device.
Figure 17B:
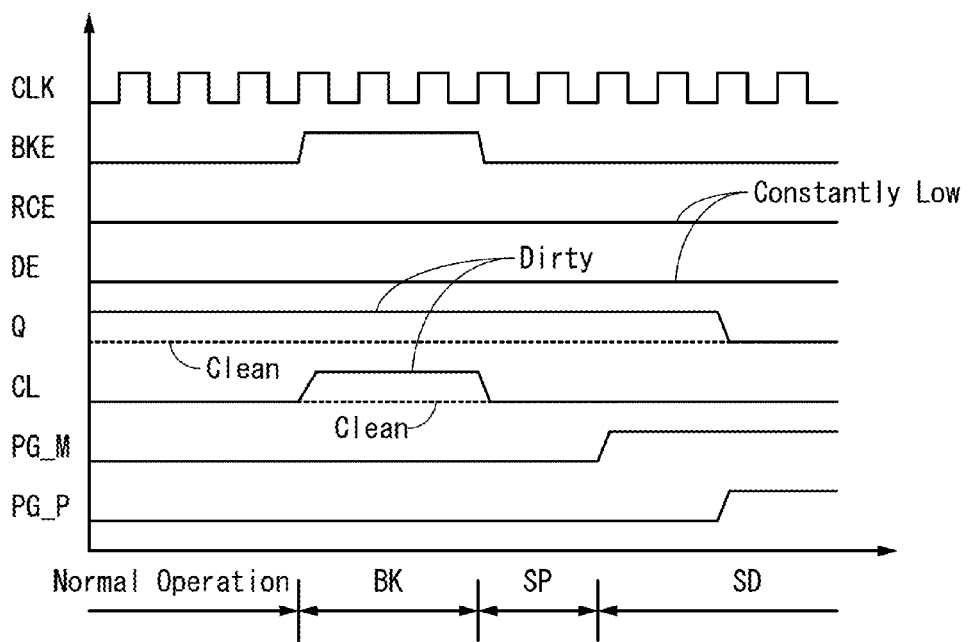

A multiplexer 165a in FIG. 16A includes a plurality of switches, and OUT_A can be "0" (potential VSSS) or "1" (potential VDDH) depending on combination of conduction of switches. As described above, when the recovery enable signal RCE is "1", OUT_A is "1" and when the backup enable signal BKE is "0", OUT_A is "0"; thus, the structure of the multiplexer 165a can be simpler than that of a common three-input multiplexer. A multiplexer 165b shown in FIG. 16B is employed to output OUT_B in Table 1.

Note that "0" and "1" of SR-FF in Table 1 can be replaced as in Table 2 below.

TABLE 2

| SR-FF | BKE | RCE | OUT_A | OUT_B |
|-------|-----|-----|-------|-------|
| 1 | 0 | 0 | 0 | 1 |
| 1 | 0 | 1 | 1 | 0 |
| 1 | 1 | 0 | 0 | 1 |
| 1 | 1 | 1 | any | any |
| 0 | 0 | 0 | 0 | 1 |
| 0 | 0 | 1 | 1 | 0 |
| 0 | 1 | 0 | 1 | 0 |
| 0 | 1 | 1 | any | any |

Also for BKE and RCE, "0" and "1" may be switched individually. A truth table in which "0" and "1" interchange is called a derivative. When "0" and "1" for SR-FF, BKE, and RCE are switched individually, there are six derivatives of Table 1 and Table 2.

Figure 14B:
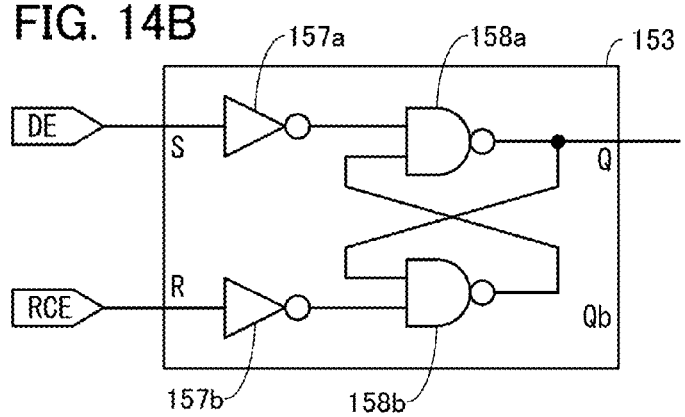

FIG. 14B is an example of a circuit configuration of the SR flip flop 153. The SR flip flop 153 includes an inverter 157a, an inverter 157b, a NAND gate 158a, and a NAND gate 158b. The dirty enable signal DE and the recovery enable signal RCE are input to the inverter 157a and the inverter 157b, respectively. The output of the NAND gate 158b and the output of the NAND gate 158a are input to the NAND gate 158a and the NAND gate 158b, respectively.

Note that one or both of the inverters 157a and 157b are not needed depending on the definition of the dirty enable signal DE and the recovery enable signal RCE. For example, when the dirty enable signal DE indicating a dirty state is low, the inverter 157a is unnecessary.

Although the dirty enable signal DE can be sometimes obtained as the output of an AND gate as described later, an AND gate is composed of a series-connected NAND gate inverter in many cases. Thus, the output signal of the inverter 157a and the output signal of the NAND gate in the AND gate are the same, and the inverter 157a is unnecessary.

In the SR flip flop 153 shown in FIG. 14B, the potential of a terminal Q is kept high when the dirty enable signal DE goes high just once. Also when the dirty enable signal DE goes high for the second time, the potential of the terminal Q is kept high. Note that when the recovery enable signal RCE goes high, the potential of the terminal Q is changed and kept at low.

In the SR flip flop 153, when the terminal to which the dirty enable signal DE is input is interchanged with the terminal to which the recovery enable signal RCE is input, the potential of the terminal Q becomes high when the recovery enable signal RCE is set high and the potential of the terminal Q becomes low when the dirty enable signal DE is set high.

Operation examples of the backup/recovery output circuit 151 and related circuits will be described with reference to FIGS. 17A and 17B.

First, recovery operation is described with reference to FIG. 17A. A power gating signal PG_M and a power gating signal PG_P are both high, and the power gating transistors 125 to 127 shown in FIG. 9 are all off in a period SD.

Then, the power gating signal PG_P is set low, and the power gating transistors 125 and 127 are turned on, so that power is supplied to the bit line driver 101, the word line driver 102, and the backup/recovery driver 103 (including the backup/recovery output circuit 151) in a period PP_ON.

Then, the recovery enable signal RCE becomes high in a period RC. The AOI gate in FIG. 14A outputs low always when the recovery enable signal RCE is high regardless of the output of the AND gate 154, and the potential of the control line CL is thus high in a period where the recovery enable signal RCE is high.

As a result, the transistors 109 and 110 in the memory cell MC are turned on, and charge accumulated in the capacitors 111 and 112 moves to the input terminals of the inverters 105 and 106.

Note that the recovery enable signal RCE is high and the dirty enable signal DE is low in the period RC; thus, the potential of the terminal Q of the SR flip flop 153 becomes low and kept low. That is, the recovery enable signal RCE also resets the SR flip flop 153.

After that, the power gating signal PG_M goes low and the power gating transistor 126 is thus turned on in a period PM_ON. Power is supplied to the memory cell array 104 (i.e., the inverters 105 and 106), and the inverters 105 and 106 output potentials corresponding to the potentials held in respective capacitors 111 and 112. Then, the recovery enable signal RCE goes low and the driving state becomes normal.

When data of the memory cell MC is rewritten (i.e., the memory cell MC is dirty) in the normal driving state, the dirty enable signal DE goes high. At this time, the backup enable signal BKE and the recovery enable signal RCE are both low, and consequently the potential of the terminal Q of the SR flip flop 153 goes high and kept high. Note that the output of the AOI gate of FIG. 14A is kept at high as long as the backup enable signal BKE or the recovery enable signal RCE is low, and thus the potential of the control line CL is kept low.

In contrast, when data of the memory cell MC is not rewritten (i.e., the memory cell MC is clean), the dirty enable signal DE does not go high and the potential of the terminal Q of the SR flip flop 153 is kept low. The output of the AOI gate in FIG. 14A is kept high and the potential of the control signal CL remains low.

Next, backup operation is described with reference to FIG. 17B. The backup enable signal BKE goes high when backup is performed (period BK).

Thus, when the potential of the terminal Q of the SR flip flop 153 is high (dirty), the AOI gate of FIG. 14A outputs low and the control line CL goes high. The transistors 109 and 110 which are connected to the control line CL are thus turned on and data of the inverters 105 and 106 are copied into the capacitors 111 and 112.

In contrast, when the potential of the terminal Q of the SR flip flop 153 is low, the output of the AOI gate of FIG. 14A is kept high even when the backup enable signal BKE goes high, and thus the potential of the control line CL is kept low. That is, backup is not performed in that case.

The power gating signals PG_M and PG_P are set to high sometime after the backup enable signal BKE goes low (i.e., after period SP) in the period SD. As shown in FIG. 17B, the power gating signal PG_P may be set high sometime after the power gating signal PG_M is set high, or the power gating signal PG_M and the power gating signal PG_P are set high at the same time. Note that it is possible that only the power gating signal PG_M is set high and the power gating signal PG_P remains low.

The dirty enable signal DE is composed of at least the write enable signal WE and a signal for identifying a region that is a subject of determination of dirty or clean, such as a row address signal RA and a subarray selection signal SEL, which are included in the address data ADDR.

Figure 14C:
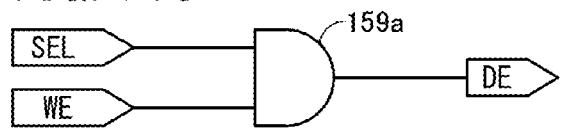

For example, the dirty enable signal DE which is obtained by inputting the subarray selection signal SEL and the write enable signal WE into an AND gate 159a as shown in FIG. 14C goes high when memory cells MC in a certain subarray are rewritten. In the case of only reading, the write enable signal WE does not go high even when the certain subarray is accessed, and thus the dirty enable signal DE remains low.

Figure 14D:
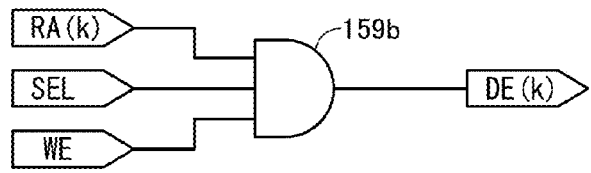

For example, a dirty enable signal DE(k) which is obtained by inputting a row address signal RA(k) for a k-th row, the subarray selection signal SEL, and the write enable signal WE into an AND gate 159b as shown in FIG. 14D goes high when memory cells MC in the k-th row in a certain subarray are rewritten. Note that when there is no need to specify a subarray, the subarray selection signal SEL is not necessarily input.

Figure 14E:
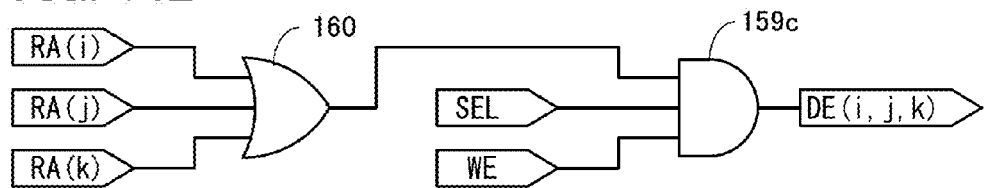

For example, as shown in FIG. 14E, a row address RA(i) in an i-th row, a row address RA(j) in a j-th row, and a row address RA(k) in a k-th row are input to an OR gate 160 and output is obtained. The obtained output, the subarray selection signal SEL, and the write enable signal WE are input to an AND gate 159c and dirty enable signals DE(i, j, k) are obtained, which go high when the memory cell MC in any of the i-th row, the j-th row, and the k-th row in a certain subarray is rewritten. Note that when there is no need to specify a subarray, the subarray selection signal SEL is not necessarily input. The i-th row, the j-th row, and the k-th row consecutive rows or not.

The circuit shown in FIG. 14E outputs the dirty enable signal DE every three rows, or can output the dirty enable signal DE every 8 or 16 rows.

For example, backup can be efficiently performed with selective backup by determining whether each row is dirty or not. Note that the backup/recovery output circuit 151 needs to be provided in each row in this case, resulting in a larger number of circuits and a larger area.

For example, when backup is performed by determining whether each memory cell array is dirty or not as shown in FIG. 10, backup is concurrently performed even when most rows are clean.

The granularity of selective backup is determined in consideration of allowed circuit configuration and area, expected power consumption, and the like. For example, a cache memory may be configured such that an L1 cache performs selective backup every row, an L2 cache performs selective backup every 4 rows, and an L3 cache performs selective backup every 16 rows, that is, the unit for performing selective backup may be increased to lower level.

FIG. 18 shows a backup/recovery driver 103e including a plurality of backup/recovery output circuit 151 shown in FIG. 14A. In the backup driver 103e, the dirty enable signals DE (dirty enable signals DE(1) to DE(n)) are input to in respective rows.

Figure 19:
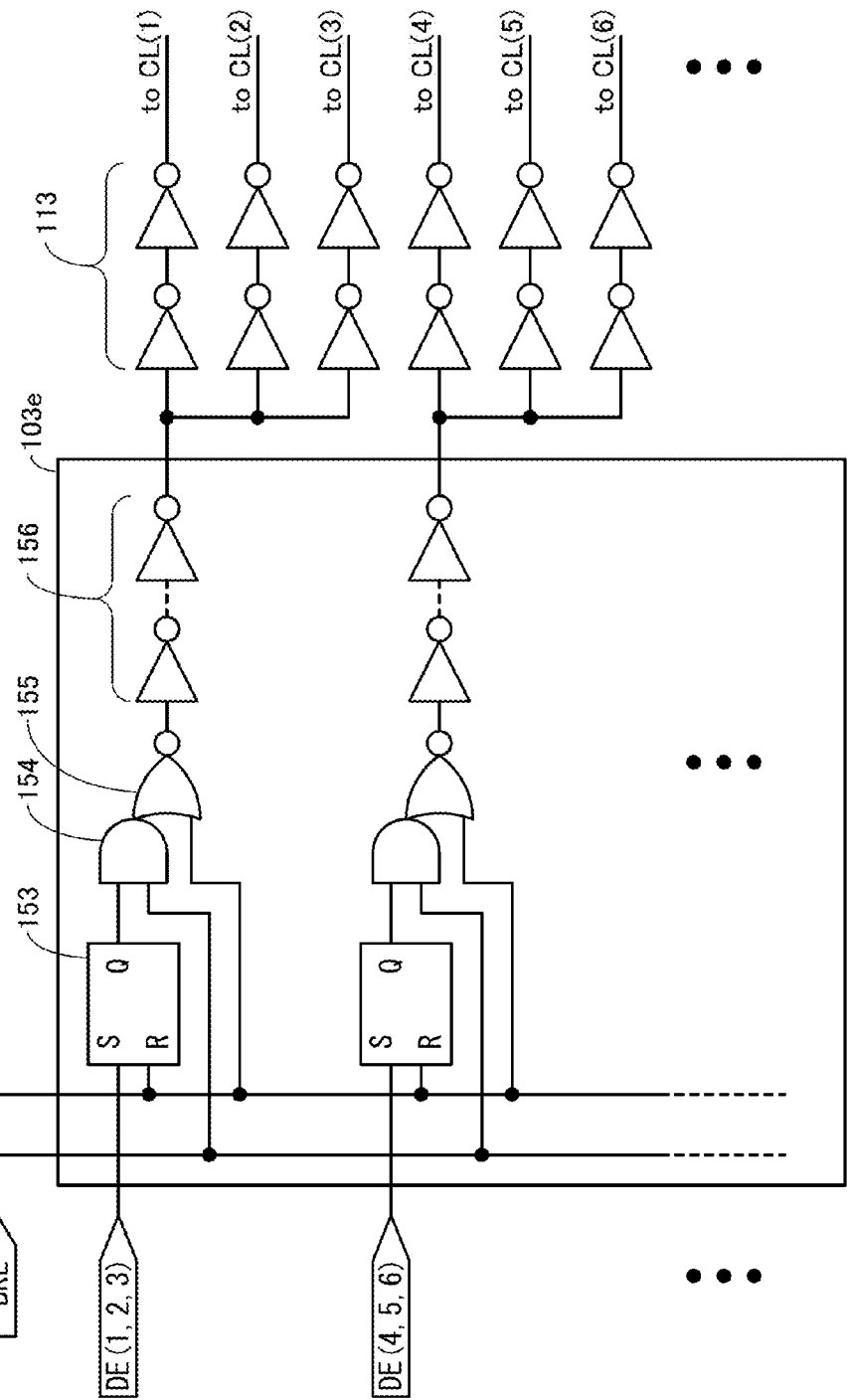
FIG. 19 illustrates a configuration example of a memory device.

FIG. 19 shows the case where the dirty enable signals DE for three rows (DE(1, 2, 3) and DE(4, 5, 6)) are input to the backup/recovery driver 103e of FIG. 18. Note that the buffer 113 is not always necessary.

Note that an SR flip flop 153 or a circuit having an equivalent function is not limited to FIG. 14B. By changing other circuit configurations appropriately, a D latch, a D flip flop, an SR-NOR latch, or the like may be used.

Figure 20A:
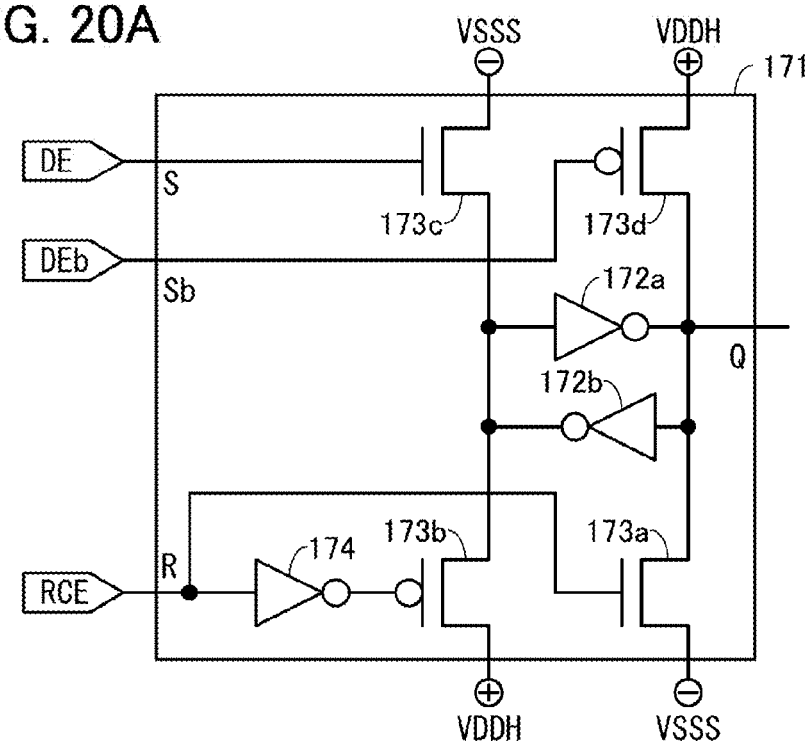
FIGS. 20A to 20C illustrate configuration examples of a memory device.

For example, a flip flop 171 shown in FIG. 20A may be used. The state of the loop of inverters 172a and 172b can be changed depending on whether an N-channel transistor 173a and a P-channel transistor 173b are on or an N-channel transistor 173c and a P-channel transistor 173d are on.

Figure 20B:
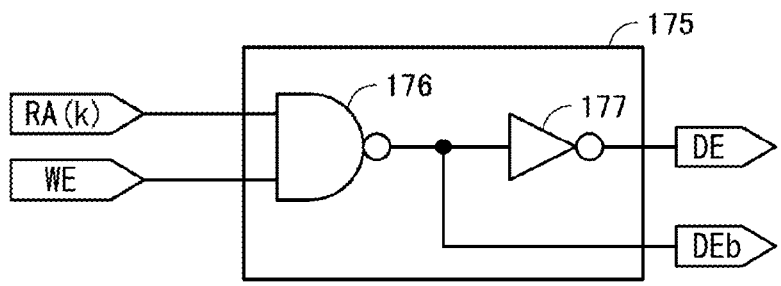

Note that an inverted dirty enable signal DEb which is an inverted signal of the dirty enable signal DE is also input to the flip flop 171. The inverted dirty enable signal DEb can be obtained by inverting the dirty enable signal DE using an inverter, or can be obtained in the process of forming the dirty enable signal DE as shown in FIG. 20B.

As shown in FIGS. 14C to 14E, the dirty enable signal DE is obtained by inputting the write enable signal WE and a signal containing address information (e.g., row address signal RA) to the AND gate. As shown in FIG. 20B, in the AND gate 175, the output of a NAND gate 176 is generally inverted using an inverter 177 to be the inverted dirty enable signal DEb.

For example, when the recovery enable signal RCE is low, the potential of the gate of the N-channel transistor 173a is low and the potential of the gate of the P-channel transistor 173b is high (because the recovery enable signal RCE is inverted by the inverter 174); thus, the N-channel transistor 173a and the P-channel transistor 173b are off.

When the dirty enable signal DE is low (the inverted dirty enable signal DEb is high), the potential of the gate of the N-channel transistor 173c is low and the potential of the gate of the P-channel transistor 173d is high; thus, the N-channel transistor 173c and the P-channel transistor 173d are off.

Then, when the recovery enable signal RCE is set high, the potential of the N-channel transistor 173a goes high and the potential of the gate of the P-channel transistor 173b goes low; thus, the N-channel transistor 173a and the P-channel transistor 173b are turned on and the potential VSSS (low potential) is output from the terminal Q (reset). The state of reset continues after the recovery enable signal RCE goes low.

When the dirty enable signal DE is high (the inverted dirty enable signal DEb is low), the potential of the gate of the N-channel transistor 173c is high and the potential of the gate of the P-channel transistor 173d is low; thus, the N-channel transistor 173c and the P-channel transistor 173d are on and the potential VDDH (high potential) is output from the terminal Q (set). The state of set continues after the dirty enable signal DE goes low and then goes high again.

As described above, the flip flop 171 operates like the SR flip flop 153, and therefore the output of the terminal Q of the flip flop 171 may be input to the AOI gate of FIG. 14A.

Note that the size of transistors in the inverters 172a and 172b may be designed so that the output of the terminal Q goes low all the time or with a high probability when supply of power to the loop of the inverters 172a and 172b restarts.

Figure 20C:
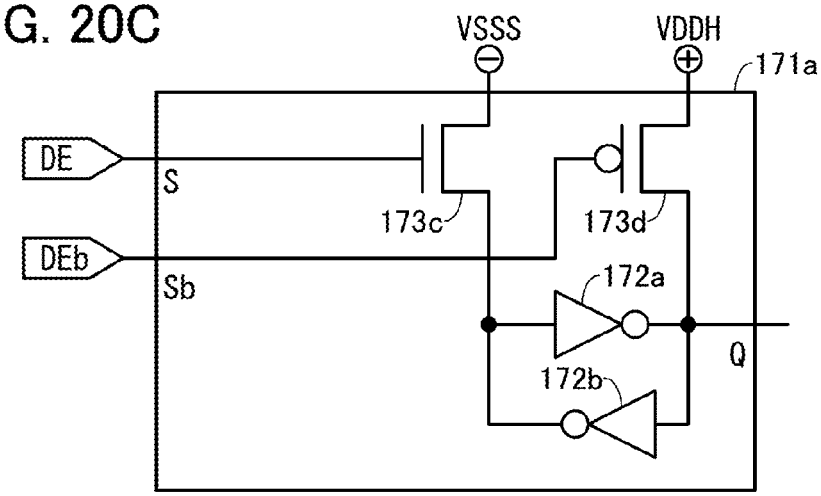

In that case, the potential of the terminal Q is automatically goes low all the time or with a high probability under the state of the period PP_ON; thus, input of the recovery enable signal RCE, and the N-channel transistor 173a, the P-channel transistor 173b, and the inverter 174 become unnecessary (see FIG. 20C).

For example, the ratio of channel width to channel length of an N-channel transistor of the inverter 172a is set larger than the ratio of a channel width to a channel length of a P-channel transistor which is set in consideration of the mobility difference, or the ratio of channel width to channel length of an N-channel transistor of the inverter 172b is set smaller than the ratio of a channel width to a channel length of a P-channel transistor which is set in consideration of the mobility difference.

As apparent from the above, any circuit can be used as the SR flip flop 153 or the equivalent circuit as long as it outputs a signal corresponding to a first signal when the first signal is input to one terminal and keeps outputting the signal even after the input of the first single is finished, and it outputs a signal corresponding to a second signal when the second signal is input to the other terminal and keeps outputting the signal even after the input of the second single is finished.

For this, the output of a given circuit element is preferably configured to be input to another circuit element of the same type or different type. For example, the circuit elements correspond to the NAND gates 158a and 158b in FIG. 14B and the inverters 172a and 172b in FIG. 20A. In general expression, the circuit element is connected to a drain of a P-channel transistor and a drain of an N-channel transistor, and a signal is output from the connection portion.

In the above examples, the control line CL is provided to be parallel to the word line WL, but may be provided to be parallel to the bit line BLa. For example, when backup is selectively performed on each memory cell array as shown in FIG. 10, the control line CL is not necessarily provided to be parallel to the word line WL. In that case, a backup/recovery driver may be provided so as to face a bit line driver with a memory cell array provided therebetween, or may be provided inside or outside the bit line driver, between the bit line driver and the memory cell array, or inside the memory cell array. In addition, the memory cell in the above examples has the circuit configuration of FIG. 1B, but the structure is not limited to this. Any configuration can be used as long as it includes a part in a memory cell which can hold data without power supply, can back up the data in the part before power supply is interrupted, and can recover the backup data after power supply is restarted.

Embodiment 2

In this embodiment, a specific device structure of the memory device 100 (or the memory devices 100a to 100g) in Embodiment 1 which is a semiconductor device including an oxide semiconductor transistor (OS transistor) and a single-crystal silicon transistor (Si transistor) will be described.

<Device Structure>

FIG. 21A is a cross-sectional view of an example of the device structure of the memory device 100 as a semiconductor device including an OS transistor and a Si transistor. Note that FIG. 21A is a cross-sectional view which is not cut the memory device 100 along a specific line, but explains the layered structure of the memory device 100. The memory device 100 in FIG. 21A includes, for example, the inverter 106, the transistor 109, and the capacitor 111 for forming the memory cell array 104 (or a memory cell MC). A transistor 202 and a transistor 203 are Si transistors for forming the inverter 106. The transistor 202 and the transistor 203 are a p-channel transistor and an n-channel transistor, respectively. The transistor 109 and the capacitor 111 are provided over the inverter 106.

The memory device 100 is formed using a semiconductor substrate. The bulk single-crystal silicon wafer 201 is used as a semiconductor substrate. Note that a substrate for forming a backplane of the memory device 100 is not limited to the bulk single-crystal silicon wafer but can be any of a variety of semiconductor substrates. For example, an SOI semiconductor substrate including a single-crystal silicon layer may be used.

The transistors 202 and 203 can be formed over the single-crystal silicon wafer 201 by a CMOS process. An insulating layer 210 electrically isolates these transistors from each other. An insulating layer 211 is formed so as to cover the transistors 202 and 203. Conductors 231 to 233 are formed over the insulating layer 211. Conductors 221 to 224 are formed in openings formed in the insulating layer 211. As illustrated, a drain of the transistor 202 and a drain of the transistor 203 are connected via the conductors 221 to 224 and the conductors 231 to 233 to form the inverter 106.

One or more wiring layers are formed over the transistors 202 and 203 by the back end of the line (BEOL) process. Insulating layers 212 to 214 and conductors 241 to 245, 251 to 256, and 261 to 265 form three-layered wiring structure.

An insulating layer 276 is formed to cover the wiring layers. The transistor 109 and the capacitor 111 are formed over the insulating layer 276.

The transistor 109 includes an oxide semiconductor layer 271, a conductor 281, a conductor 282, and a conductor 291. The oxide semiconductor layer 271 includes a channel formation region. The conductor 291 serves as a gate electrode. The conductors 281 and 282 serve as a source electrode and a drain electrode, respectively. The conductor 282 is connected to the inverter 106 via the conductors 251 to 256.

Although not illustrated, the conductor 282 is also connected to an input terminal of the inverter 105 (i.e., a gate electrode of a transistor forming the inverter 105).

The capacitor 111 is a MIM capacitor, including the conductor 281 and a conductor 292 as electrodes and the insulating layer 277 as a dielectric (insulating film). The insulating layer 277 also serves as an insulator included in a gate insulating layer of the transistor 109.

An insulating layer 278 is formed to cover the transistor 109 and the capacitor 111. Conductors 296 and 297 are formed over the insulating layer 278. The conductors 296 and 297 are connected to the transistor 109 and the capacitor 111, respectively, and serve as electrodes (wirings) for connecting these elements to the layered wiring structure. For example, as illustrated, the conductor 296 is connected to the conductor 261 by the conductors 262 to 265 and a conductor 284, and the conductor 297 is connected to the conductor 241 by the conductors 242 to 245 and a conductor 283.

The films included in the semiconductor device (i.e., the insulating film, the semiconductor film, the metal oxide film, the conductive film, and the like) can be formed by any of a sputtering method, a chemical vapor deposition (CVD) method, a vacuum evaporation method, and a pulsed laser deposition (PLD) method. A coating method or a printing method can be used. As the CVD method, a plasma-enhanced chemical vapor deposition (PECVD) method or a thermal CVD method is used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Each of the insulating layers of the memory device 100 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film.

Note that in this specification, an oxynitride refers to a substance that contains more oxygen than nitrogen, and a nitride oxide refers to a substance that contains more nitrogen than oxygen.

Each of the conductors of the memory device 100 can be formed using one conductive film or two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

<Another Structure Example of Transistor>

The structures of the Si transistor and the OS transistor included in the semiconductor device are not limited to those in FIG. 21A. For example, the OS transistor may include a back gate.

Alternatively, the OS transistor can have a structure as illustrated in FIG. 21B. In FIG. 21B, the transistor 109 further includes an oxide semiconductor layer 273. A channel is formed in the oxide semiconductor layer 271 also in the transistor 109 of FIG. 21B.

To form the transistor 109 of FIG. 21B, the conductors 281 and 282 are formed and then an oxide semiconductor film for the oxide semiconductor layer 273, an insulating film for the insulating layer 277, and a conductive film for the conductor 291 are stacked. This stacked films are etched using a resist mask for etching the conductive film, and the oxide semiconductor layer 273 and the conductor 291 are formed. Here, a region of the insulating layer 277 which is not covered with the conductor 292 is removed in the capacitor 111.

For example, in the transistor 109 in FIG. 21A, the oxide semiconductor layer 271 is formed of two layers of oxide semiconductor films having different constituent elements. In this case, the lower layer is formed using an In—Zn-based oxide film and the upper layer is formed using an In—Ga—Zn-based oxide film, or each of the lower layer and the upper layer may be formed using an In—Ga—Zn-based oxide film.

For example, in the case where the oxide semiconductor layer 271 is formed using two In—Ga—Zn-based oxide films, one of the films can be formed using an oxide film with an atomic ratio of In:Ga:Zn=1:1:1, 5:5:6, or 3:1:2, and the other of the films can be formed using an oxide film with an atomic ratio of In:Ga:Zn=1:3:2, 1:3:4, 1:3:6, 1:6:4, or 1:9:6.

In FIG. 21B, when the oxide semiconductor layer 271 has a two-layer structure and the oxide semiconductor layer 273 has a single-layer structure, the transistor 109 may be formed using an oxide semiconductor film with a three-layer structure. Also in this case, all or part of the three layers may be formed using oxide semiconductor films including different constituent elements, or the three layers may be formed using oxide semiconductor films including the same constituent element.

For example, in the case where each of the oxide semiconductor layers 271 and 273 is formed using an In—Ga—Zn-based oxide film, each of the lower layer of the oxide semiconductor layer 271 and the oxide semiconductor layer 273 can be formed using an oxide film with an atomic ratio of In:Ga:Zn=1:3:2, 1:3:4, 1:3:6, 1:6:4, or 1:9:6, and the upper layer of the oxide semiconductor layer 271 can be formed using an oxide film with an atomic ratio of In:Ga:Zn=1:1:1, 5:5:6, or 3:1:2.

Figure 22:
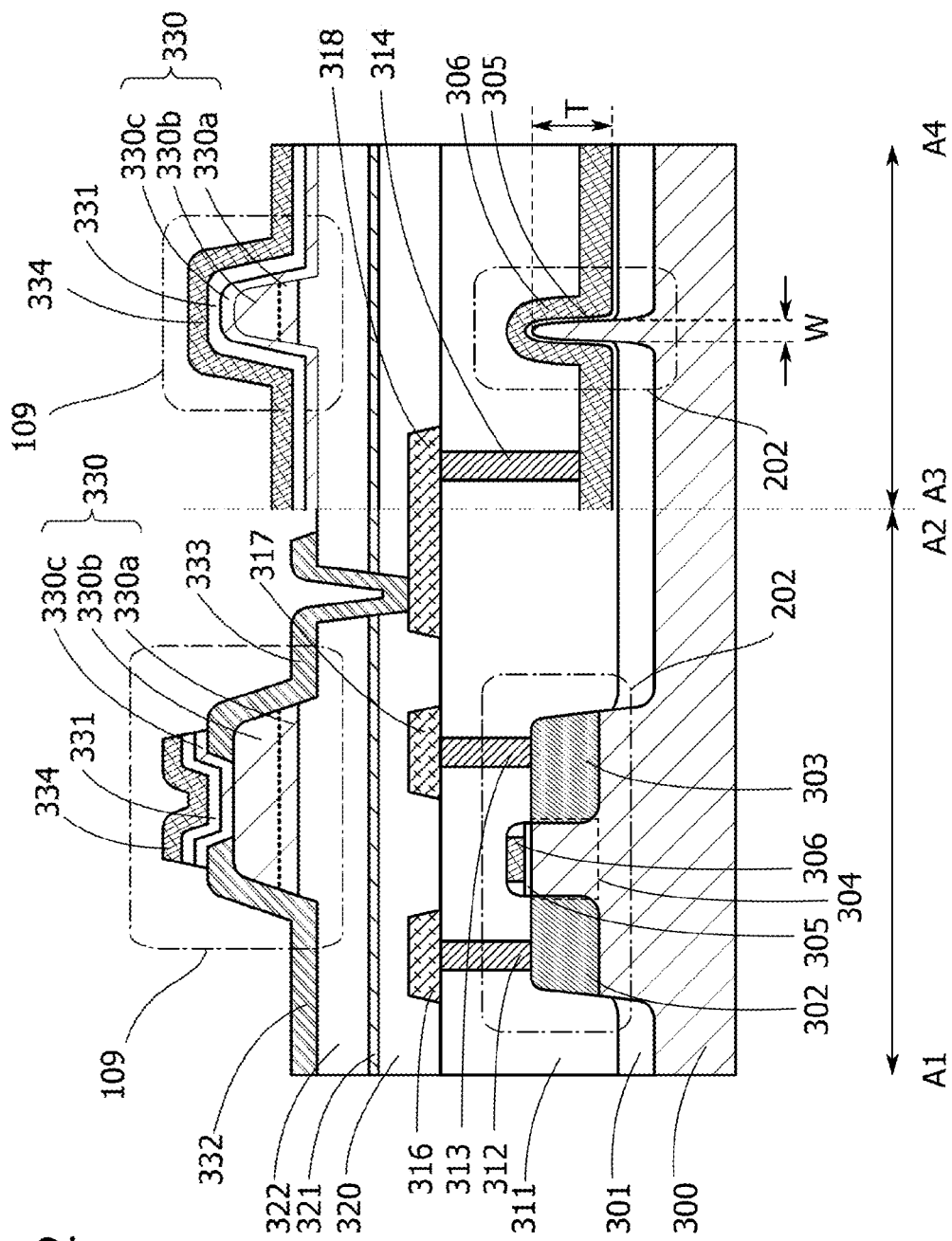
FIG. 22 illustrates an example of a cross-sectional structure of a memory device.

FIG. 22 shows another structure example of a Si transistor and an OS transistor.

FIG. 22 is a cross-sectional view showing another structure example of a Si transistor and an OS transistor. In FIG. 22, the cross section A1-A2 shows the Si transistor 202 and the OS transistor 109 in the channel length direction (the direction from the source to the drain), and the cross section A3-A4 shows these transistors in the channel width direction (the direction perpendicular to the channel length direction). Note that in the layout, the channel length direction of the transistor 202 does not necessarily agree with that of the transistor 109. FIG. 22 is for illustrating a cross-sectional structure. In FIG.

22, the OS transistor 109 including a channel formation region in an oxide semiconductor film is formed over the transistor 202 including a single-crystal silicon channel formation region. A single crystal silicon substrate is used as the substrate 300 in FIG. 22. Note that a plurality of layers with different conductivities or a well may be stacked over the substrate 300.

The transistor 202 is electrically isolated from other semiconductor elements by an element isolation method. As the element isolation method, a trench isolation method (a shallow trench isolation (STI) method) or the like is used. FIG. 22 illustrates an example where the trench isolation method is used to electrically isolate the transistor 202. Specifically, FIG. 22 shows an example in which the transistor 202 is isolated using an element isolation region 301. The element isolation region 301 is formed in the following manner: a trench which is formed in the substrate 300 by etching or the like is filled with an insulator including silicon oxide or the like, and then, the insulator is partially removed by etching or the like.

In a projection of the semiconductor substrate 300 that exists in a region other than the trench, an impurity region 302 and an impurity region 303 of the transistor 202 and a channel formation region 304 placed between the impurity regions 302 and 303 are provided. The transistor 202 also includes an insulating layer 305 covering the channel formation region 304 and a gate electrode 306 that overlaps the channel formation region 304 with the insulating layer 305 placed therebetween.

In the transistor 202, a side portion and an upper portion of the projection in the channel formation region 304 overlaps with the gate electrode 306 with the insulating layer 305 positioned therebetween, so that carriers flow in a wide area including a side portion and an upper portion of the channel formation region 304. Thus, the area of the transistor 202 in the substrate can be small, and the amount of transfer of carriers in the transistor 202 can be increased. As a result, the on-state current of the transistor 202 are increased. Suppose the length of the projection of the channel formation region 304 in the channel width direction (i.e., channel width) is W and the thickness of the projection of the channel formation region 304 is T. When the aspect ratio that corresponds to the ratio of the thickness T to the channel width W is high, a region where carrier flows becomes wider. Thus, the on-state current of the transistor 202 is further increased and the field-effect mobility of the transistor 202 is further increased.

Note that when the transistor 202 is formed using a bulk semiconductor substrate, the aspect ratio is desirably 0.5 or more, more desirably 1 or more.

An insulating layer 311 is provided over the transistor 202. Openings are formed in the insulating layer 311. A conductor 312, a conductor 313, and a conductor 314 that are electrically connected to the impurity region 302, the impurity region 303, and the gate electrode 306, respectively, are formed in the openings. The conductor 312 is electrically connected to a conductor 316 over the insulating layer 311. The conductor 313 is electrically connected to a conductor 317 over the insulating layer 311. The conductor 314 is electrically connected to a conductor 318 over the insulating layer 311.

An insulating layer 320 is provided over the conductors 316 to 318. An insulating layer 321 having an effect of blocking diffusion of oxygen, hydrogen, and water is provided over the insulating layer 320. An insulating layer 322 is provided over the insulating layer 321. The transistor 109 is provided over the insulating layer 321.

As the insulating layer 321 has higher density and becomes denser or has a fewer dangling bonds and becomes more chemically stable, the insulating layer 321 has a higher blocking effect. The insulating layer 321 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating layer 321 having an effect of blocking diffusion of hydrogen and water can be formed using silicon nitride or silicon nitride oxide, for example.

The transistor 109 includes an oxide semiconductor layer 330, conductors 332 and 333 in contact with the oxide semiconductor layer 330, an insulating layer 331 covering the oxide semiconductor layer 330, and a gate electrode 334 that overlaps the oxide semiconductor layer 330 with the insulating layer 331 placed therebetween. The conductors 332 and 333 function as source and drain electrodes. The conductor 333 is connected to the conductor 318 in an opening formed in the insulating layers 320 to 332.

In this case, it is possible that an opening is formed in the insulating layer and a conductor that is in contact with the gate electrode 334 in the opening is provided over the insulating layer.

Note that in FIG. 22, the transistor 109 includes the gate electrode 334 on at least one side of the oxide semiconductor layer 330. The transistor 109 may also include a gate electrode that overlaps the oxide semiconductor layer 330 with the insulating layer 322 placed therebetween.

When the transistor 109 includes a pair of gate electrodes, one of the gate electrodes may be supplied with a signal for controlling the on/off state, and the other of the gate electrodes may be supplied with another potential independently of the one of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 22, the transistor 109 has a single-gate structure where one channel formation region corresponding to one gate electrode 334 is provided. When a plurality of gate electrodes electrically connected to each other are provided in the transistor 109, for example, the transistor 109 can have a multi-channel structure where a plurality of channel formation regions are included in one oxide semiconductor layer.

FIG. 22 is an example in which the oxide semiconductor layer 330 of the transistor 109 has a three-layered structure of oxide semiconductor layers 330a to 330c. The side surfaces of the oxide semiconductor layers 330a and 330b are covered with the oxide semiconductor layer 330c. Note that one or two of the oxide semiconductor layers 330a to 330c may be omitted. For example, the oxide semiconductor layer 330 of the transistor 109 may be a single-layered metal oxide film.

Embodiment 3

<<Oxide Semiconductor>>

In this embodiment, the oxide semiconductor used in the OS transistor will be described.

The channel formation region of the OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1\times10^{17}/cm^3$. The carrier density is preferably lower than $1\times10^{15}/cm^3$, further preferably lower than $1\times10^{13}/cm^3$.

By forming the channel formation region using a purified OS, the normalized off-state current of the OS transistor can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in the oxide semiconductor. The impurity level becomes a trap, which might degrade the electrical characteristics of the OS transistor. It is preferable to reduce the concentration of the impurities in the oxide semiconductor and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor. The purified OS has any of the following impurity concentration levels.

For example, in the case where the impurity includes silicon, the concentration of silicon is lower than $1\times10^{19}$ atoms/$cm^3$, preferably lower than $5\times10^{18}$ atoms/$cm^3$, further preferably lower than $1\times10^{18}$ atoms/$cm^3$.

For example, in the case where the impurity includes hydrogen, the concentration of hydrogen is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$.

For example, in the case where the impurity includes nitrogen, the concentration of nitrogen is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1\times10^{19}$ atoms/$cm^3$, preferably lower than $5\times10^{18}$ atoms/$cm^3$, further preferably lower than $1\times10^{18}$ atoms/$cm^3$. For example, the concentration of carbon is set lower than $1\times10^{19}$ atoms/$cm^3$, preferably lower than $5\times10^{18}$ atoms/$cm^3$, further preferably lower than $1\times10^{18}$ atoms/$cm^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn. An oxide semiconductor having an appropriate composition may be formed in accordance with needed electrical characteristics (e.g., field-effect mobility and threshold voltage).

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor varies within a range of ±20% as an error.

For example, in the case where an In—Ga—Zn-based oxide is formed by sputtering, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor (relative density) of such a target is preferably higher than or equal to 90%, further preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of $In_2O_3$:ZnO=25:1 to 1:4) as an In—Zn-based oxide deposition target. The atomic ratio of In:Zn is preferably 15:1 to 1.5:1 (the molar ratio of $In_2O_3$:ZnO=3:4 to 15:2). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<Structure of Oxide Semiconductor Film>

A structure of the oxide semiconductor film is described below. In the following description of a crystal structure, the term "parallel" indicates that the angle formed between two straight lines is greater than or equal to −10° and less than or equal to 10°, and accordingly also includes the case where the angle is greater than or equal to −5° and less than or equal to 5°. The term "substantially perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is an oxide semiconductor film including a plurality of crystal parts.

In a transmission electron microscope (TEM) image of the CAAC-OS film, a boundary between crystal parts, that is, a clear grain boundary is not observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Figure 23A:
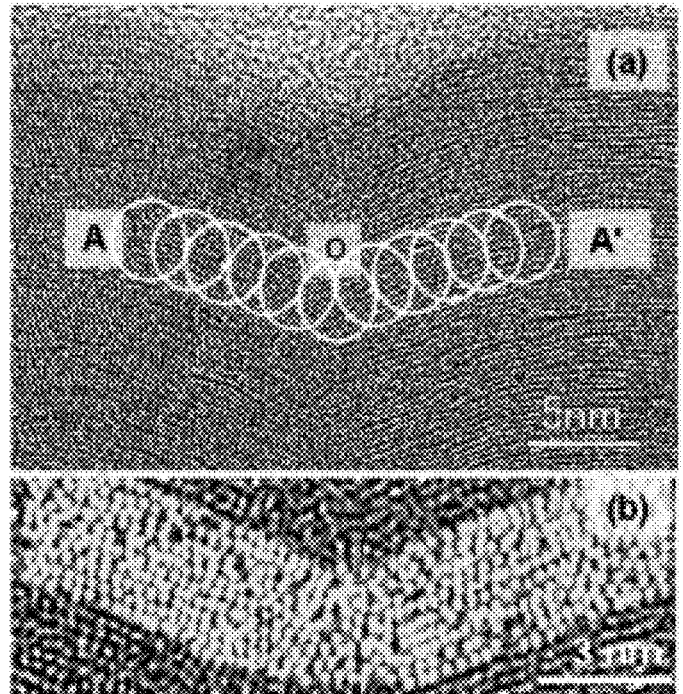
FIGS. 23A to 23C illustrate an example of a structure of an oxide semiconductor.
Figure 23B:
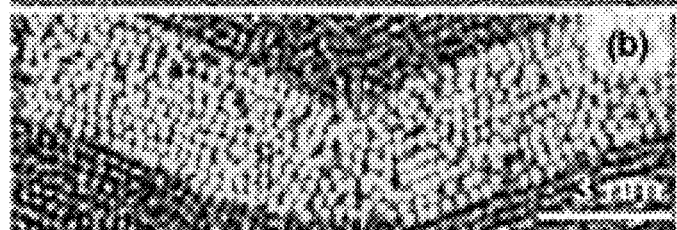

FIG. 23A is a cross-sectional TEM image of a CAAC-OS film. FIG. 23B is a cross-sectional TEM image obtained by enlarging the image of FIG. 23A. In FIG. 23B, atomic arrangement is highlighted for easy understanding.

Figure 23C:
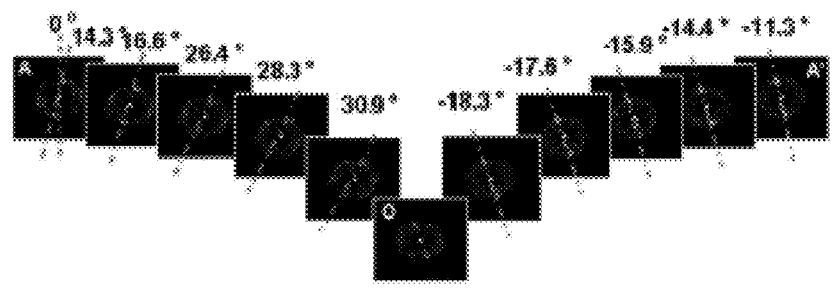

FIG. 23C is Fourier transform images of regions each surrounded by a circle (the diameter is approximately 4 nm) between A and O and between O and A' in FIG. 23A. C-axis alignment can be observed in each region in FIG. 23C. The c-axis direction between A and O is different from that between O and A', which indicates that a grain in the region between A and O is different from that between O and A'. In addition, between A and O, the angle of the c-axis continuously and gradually changes from 14.3°, 16.6° to 30.9°. Similarly, between O and A', the angle of the c-axis continuously changes from −18.3°, −17.6°, to −11.3°.

Figure 24A:
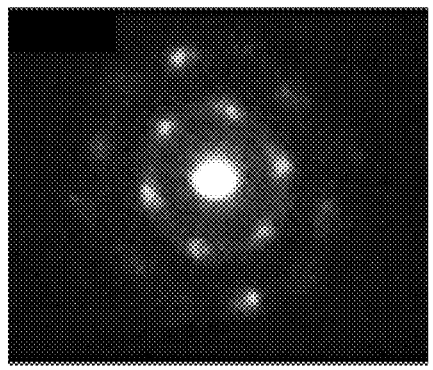
FIGS. 24A to 24D illustrate an example of a structure of an oxide semiconductor.
Figure 24B:
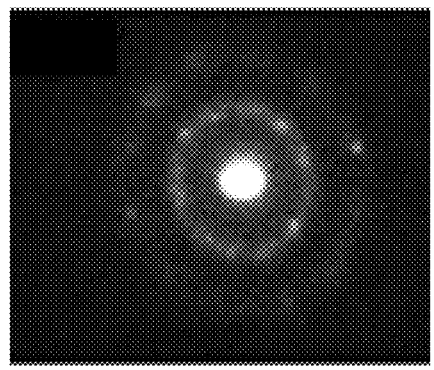

Note that in an electron diffraction pattern of the CAAC-OS film, spots (luminescent spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (see FIG. 24B).

From the results of the cross-sectional TEM image and the plan TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 μm$^2$, or larger than or equal to 1000 μm$^2$ is observed in some cases in the planar TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2 θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak do not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In an OS transistor including the CAAC-OS film, changes in electrical characteristics of the transistor due to irradiation with visible light or ultraviolet light are small. Thus, the transistor has high reliability.

<Microcrystalline Oxide Semiconductor Film>

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 24B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

However, even when the substance 28 is a CAAC-OS film, a diffraction pattern that is partly similar to that of an nc-OS film is observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 60%, preferably higher than or equal to 80%, further preferably higher than or equal to 90%, still further preferably higher than or equal to 95%. Note that a proportion of a region where a pattern different from that of a CAAC-OS film is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 24C:
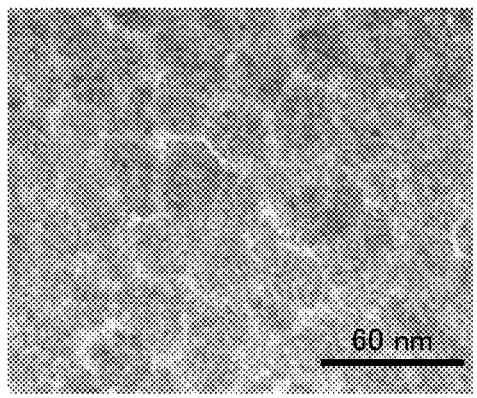
Figure 24D:
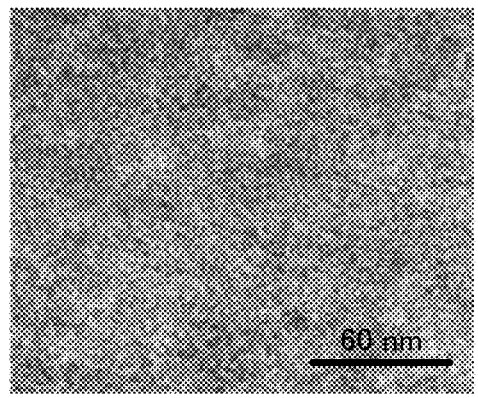

FIGS. 24C and 24D are planar TEM images of the CAAC-OS film obtained just after the deposition (as-sputtered) and the CAAC-OS film subjected to the heat treatment at 450° C., respectively. Comparison between FIGS. 24C and 24D shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Embodiment 4

The above-described arithmetic processing unit including a memory device can be used for various semiconductor devices and electronic appliances. Examples of such electronic devices are display devices, personal computers, and image reproducing devices provided with recording media (devices that read image data of recording media such as digital versatile discs (DVDs) and have displays for displaying images). Other examples are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 25A to 25F each illustrate specific examples of these electronic devices.

Figure 25A:
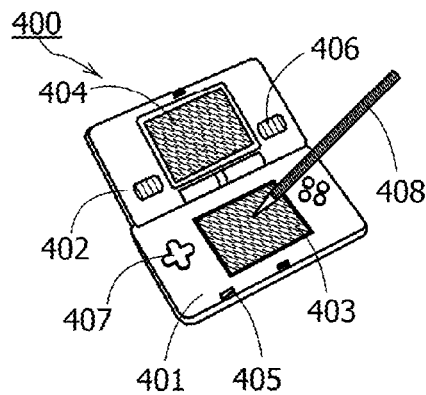
FIGS. 25A to 25F illustrate electronic devices each including an arithmetic processing unit.

FIG. 25A is an external view illustrating a structure example of a portable game machine. A portable game machine 400 includes a housing 401, a housing 402, a display portion 403, a display portion 404, a microphone 405, speakers 406, an operation key 407, a stylus 408, and the like.

Figure 25B:
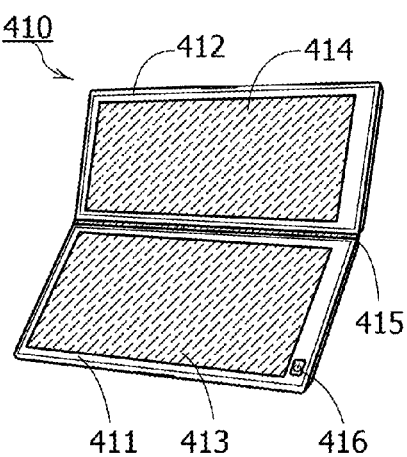

FIG. 25B is an external view illustrating a structure example of a portable information terminal. A portable information terminal 410 includes a housing 411, a housing 412, a display portion 413, a display portion 414, a joint 415, an operation key 416, and the like. The display portion 413 is provided in the housing 411, and the display portion 414 is provided in the housing 412. The housings 411 and 412 are connected to each other with the joint 415, and an angle between the housings 411 and 412 can be changed with the joint 415. Images displayed on the display portion 413 may be switched in accordance with the angle at the joint 415 between the housing 411 and the housing 412. Note that the display portion 413 and/or the display portion 414 may be touch panels.

Figure 25C:
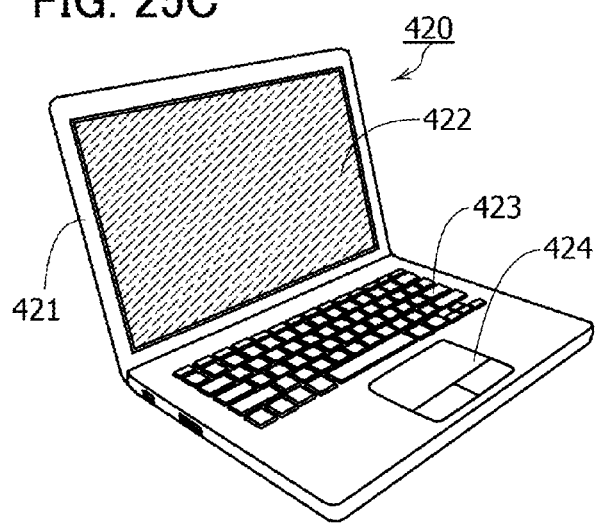

FIG. 25C is an external view illustrating a structure example of a laptop. A personal computer 420 includes a housing 421, a display portion 422, a keyboard 423, a pointing device 424, and the like.

Figure 25D:
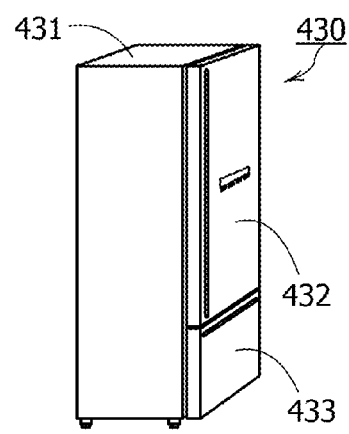

FIG. 25D is an external view illustrating a structure example of an electric refrigerator-freezer. The electric refrigerator-freezer 430 includes a housing 431, a refrigerator door 432, a freezer door 433, and the like.

Figure 25E:
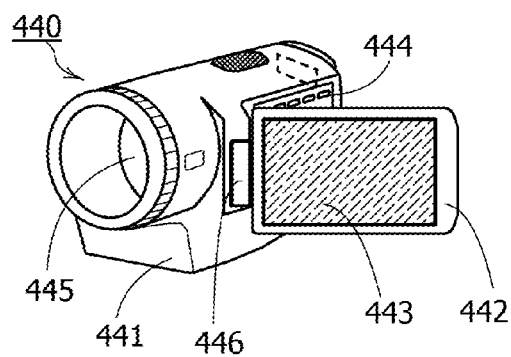

FIG. 25E is an external view illustrating a structure example of a video camera. The video camera 440 includes a housing 441, a housing 442, a display portion 443, operation keys 444, a lens 445, a joint 446, and the like. The operation keys 444 and the lens 445 are provided in the housing 441, and the display portion 443 is provided in the housing 442. The housing 441 and the housing 442 are connected to each other with the joint 446, and an angle between the housing 441 and the housing 442 can be changed with the joint 446. The direction of an image on the display portion 443 may be changed and display and non-display of an image may be switched depending on the angle between the housing 441 and the housing 442.

Figure 25F:
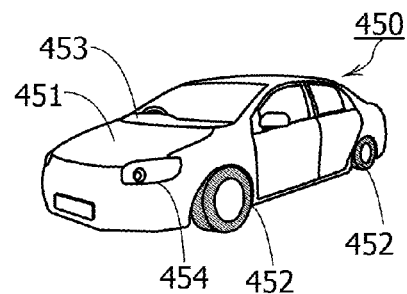

FIG. 25F is an external view illustrating a structure example of a motor vehicle. The motor vehicle 450 includes a car body 451, wheels 452, a dashboard 453, lights 454, and the like.

The memory device in the above embodiments can be used for a cache memory, a main memory, or a storage of various kinds of arithmetic processing unit (e.g., a CPU, a microcontroller, a programmable device such as FPGA, and an RFID tag).

This implementation can be implemented in appropriate combination with any of the other implementations and the like.

This application is based on Japanese Patent Application serial no. 2013-216907 filed with Japan Patent Office on Oct. 18, 2013, the entire contents of which are hereby incorporated by reference.

What is claimed is:

1. An arithmetic processing unit comprising:
   a memory cell array comprising memory cells in a matrix, each of the memory cells comprising:
      a first inverter;
      a second inverter;
      a transistor; and
      a capacitor,
      wherein an output of the first inverter is directly or indirectly input to the second inverter,
      wherein an output of the second inverter is directly or indirectly input to the first inverter,
      wherein an output of the first inverter or the second inverter is directly or indirectly input to the capacitor via the transistor,
   a circuit,
      wherein the circuit performs a first processing to supply power to the memory cells and transfer data from the capacitors to the first inverters or the second inverters, and
      wherein the circuit performs a second processing to supply the power to the memory cells and transfer data from the first inverters or the second inverters to the capacitors,
   wherein when data in any memory cell in a first region of the memory cell array is not rewritten after the first processing, the circuit stops to supply the power to the memory cells in the first region without the second processing, and
   wherein when data in at least one memory cell in the first region of the memory cell array is rewritten after the first processing, the circuit performs the second processing and stops to supply the power to the memory cells in the memory cell array.

2. The arithmetic processing unit according to claim 1, wherein a signal for identifying the first region of the memory cell array and a signal for instructing data writing to the memory cell array are input to the circuit.

3. The arithmetic processing unit according to claim 1, wherein the circuit is connected to a plurality of wirings, wherein each of the plurality of wirings is connected to a gate of the transistor in the memory cell, and
   wherein the first processing and the second processing are performed by changing potentials of the plurality of wirings.

4. The arithmetic processing unit according to claim 1, wherein the transistor comprises a channel formation region in an oxide semiconductor.

5. The arithmetic processing unit according to claim 1, wherein the transistor comprises a channel formation region in a semiconductor film.

6. The arithmetic processing unit according to claim 1, wherein the circuit includes an SR flip flop and an AOI gate, wherein an output of the SR flip flop is input to the AOI gate, and
wherein an output of the AOI gate determines output of the circuit.

7. A driving method of an arithmetic processing unit including a first inverter, a second inverter, a transistor, and a capacitor in each of memory cells arranged in a matrix in a memory cell array,
wherein an output of the first inverter is directly or indirectly input to the second inverter,
wherein an output of the second inverter is directly or indirectly input to the first inverter, and
wherein an output of the first inverter or the second inverter is directly or indirectly input to the capacitor via the transistor,
comprising the steps of:
performing a first process for supplying power to the memory cells and transferring data from the capacitors to the first inverters or the second inverters; and
performing a second process for supplying the power to the memory cells in a first region of the memory cell array and transferring data from the first inverters or the second inverters to the capacitors, when any of the memory cells in the first region is rewritten after the first process,
wherein supplying the power to the memory cells is stopped without the second process, when any of the memory cells in the first region is not rewritten after the first process.

8. The driving method of an arithmetic processing unit, according to claim 7,
wherein the arithmetic processing unit is configured to determine that data is rewritten in any of the memory cells in the first region, when a signal for identifying the first region of the memory cell array and a signal for instructing data writing to the memory cell array are input at the same time.

9. The driving method of an arithmetic processing unit, according to claim 7,
wherein the first process and the second process are performed by changing a potential of a gate of the transistor.

10. The driving method of an arithmetic processing unit, according to claim 7,
wherein the transistor comprises a channel formation region in an oxide semiconductor.

* * * * *